(12) United States Patent
Tischler

(10) Patent No.: US 10,393,330 B2
(45) Date of Patent: Aug. 27, 2019

(54) LED LIGHTING SYSTEM INCORPORATING FOLDED LIGHT SHEETS

(71) Applicant: Michael A. Tischler, Vancouver (CA)

(72) Inventor: Michael A. Tischler, Vancouver (CA)

(73) Assignee: COOLEDGE LIGHTING INC., Richmond, BC (CA)

( * ) Notice: Subject to any disclaimer, the term of this patent is extended or adjusted under 35 U.S.C. 154(b) by 0 days.

(21) Appl. No.: 16/027,660

(22) Filed: Jul. 5, 2018

(65) Prior Publication Data
US 2018/0372281 A1 Dec. 27, 2018

Related U.S. Application Data

(63) Continuation of application No. 14/810,630, filed on Jul. 28, 2015, now abandoned.

(60) Provisional application No. 62/029,744, filed on Jul. 28, 2014.

(51) Int. Cl.
| | |
|---|---|
| *H01L 33/62* | (2010.01) |
| *F21S 4/20* | (2016.01) |
| *F21K 9/90* | (2016.01) |
| *H05K 1/00* | (2006.01) |
| *H05K 1/02* | (2006.01) |
| *H05K 1/18* | (2006.01) |
| *F21Y 105/10* | (2016.01) |
| *F21Y 103/10* | (2016.01) |
| *F21Y 115/10* | (2016.01) |

(52) U.S. Cl.
CPC ............... *F21S 4/20* (2016.01); *F21K 9/90* (2013.01); *H01L 33/62* (2013.01); *H05K 1/00* (2013.01); *H05K 1/0286* (2013.01); *H05K 1/189* (2013.01); *F21Y 2103/10* (2016.08); *F21Y 2105/10* (2016.08); *F21Y 2115/10* (2016.08); *H05K 2201/055* (2013.01); *H05K 2201/09127* (2013.01); *H05K 2201/10106* (2013.01)

(58) Field of Classification Search
None
See application file for complete search history.

(56) References Cited

U.S. PATENT DOCUMENTS

| 8,348,474 | B1 | 1/2013 | Livesay et al. |
| 8,410,726 | B2 * | 4/2013 | Dau .................. F21K 9/235 315/312 |
| 9,696,019 | B2 * | 7/2017 | Palfreyman ............ F21V 21/14 |
| 2008/0101070 | A1 | 5/2008 | Chou |
| 2008/0191220 | A1 | 8/2008 | Daniels et al. |
| 2009/0261368 | A1 | 10/2009 | Wang et al. |
| 2009/0316406 | A1 | 12/2009 | Livesay et al. |
| 2010/0135018 | A1 | 6/2010 | Plank |

(Continued)

FOREIGN PATENT DOCUMENTS

JP 2013-016406 A 1/2013

OTHER PUBLICATIONS

International Search Report and Written Opinion issued in a corresponding International Application No. PCT/US2015/042344 dated Nov. 11, 2015.

*Primary Examiner* — Benjamin P Sandvik
(74) *Attorney, Agent, or Firm* — Morgan, Lewis & Bockius LLP

(57) ABSTRACT

In accordance with certain embodiments, flexible light sheets are folded to define first and second portions of the light sheet divided by the fold, and the first and second portions of the light sheet may both feature light-emitting elements thereon.

29 Claims, 10 Drawing Sheets

(56) References Cited

U.S. PATENT DOCUMENTS

| | | |
|---|---|---|
| 2012/0068622 A1 | 3/2012 | Ward |
| 2012/0146066 A1 | 6/2012 | Tischler et al. |
| 2012/0217496 A1 | 8/2012 | Tischler et al. |
| 2013/0083540 A1 | 4/2013 | Lo et al. |
| 2013/0140430 A1 | 6/2013 | Roberts |
| 2013/0235577 A1 | 9/2013 | Park et al. |
| 2014/0104792 A1 | 4/2014 | Jeziorek |
| 2014/0321126 A1* | 10/2014 | Narag .................. H05K 1/189 362/306 |
| 2016/0025311 A1 | 1/2016 | Tischler |

\* cited by examiner

LED LIGHTING SYSTEM INCORPORATING FOLDED LIGHT SHEETS

RELATED APPLICATION

This application is a continuation of U.S. patent application Ser. No. 14/810,630, filed Jul. 28, 2015, which claims the benefit of and priority to U.S. Provisional Patent Application No. 62/029,744, filed Jul. 28, 2014, the entire disclosure of each of which is hereby incorporated herein by reference.

FIELD OF THE INVENTION

In various embodiments, the present invention generally relates to electronic devices, and more specifically to array-based electronic devices.

BACKGROUND

Lighting design and the design of luminaires, fixtures and other lighting systems is often constrained by the limitations of the illumination source. In many applications, it is not easy or perhaps not possible to achieve a desired lighting effect with conventional illumination sources. For example, fluorescent tubes are available in a relatively small variety of fixed lengths. Incandescent and halogen lamps, e.g., A19 lamps, PAR lamps, and the like also generally have fixed sizes. Furthermore, these lamps are available in a relatively small number of light intensity ranges. Solid-state illumination sources such as LEDs by themselves are relatively small, but are typically mounted on rigid printed circuit boards and may require significant heat-sinking and/or thermal management. Thus, for solid-state lighting, while unique printed circuit boards may be designed and constructed, this is a time-consuming and costly process that prohibits cost-effective manufacture of a wide range of systems having different geometries. Furthermore, all such illumination sources are rigid, precluding easy implementation in applications requiring curved or arbitrarily shape illumination sources.

Relatively uniform and homogenous illumination is also a typical goal for illumination applications. For example, in systems made up of multiple conventional lamps, the large size of each light source (lamp or bulb) often results in non-uniform illumination, particularly in regions between lamps. In addition, in systems having multiple in-line fluorescent tubes, the regions between lamps for the sockets may result in undesirable socket shadow. The smaller size of solid-state emitters such as LEDs permits closer spacing; however, the large numbers of LEDs required to achieve high spatial uniformity have conventionally been limited to very expensive systems, because of the relatively high cost of the large number of LEDs.

One approach to improving uniformity is to increase the optical mixing between the multiple discrete illumination sources. One way to do this is with a diffuser and a mixing chamber. The amount of homogeneity is related to the amount of diffusion and the size of the mixing chamber—larger chambers are required for high uniformity, larger size illumination sources, larger spacing between illumination sources and for high-efficiency diffusers (high efficiency means relatively high transmittance and thus relatively low mixing or diffusion). Thus, higher uniformity may be possible, but it comes at the expense of size and rigidity—such systems are not amenable to small systems or free-form systems or systems requiring customization, for example signage, back illumination of custom panels or signs, channel lettering, or custom-length fixtures. For example, a family of free-form luminaires (for example having different shapes and/or sizes) will often require a different circuit board, or a set of different circuit boards for each luminaire in the family. Piecing together a large number of custom circuit boards increases installation difficulty, and also increases cost and reduces reliability.

In other applications, it is necessary to tailor the length or layout or shape of illumination sources to a specific fixture or system length or shape in order to achieve constant and uniform illumination over the entire fixture. For example, linear luminaires, such as slot lights, cove lights, linear fixtures, and the like often require customization (e.g., length customization) to fit a specific area or room. This is typically not possible with fluorescent lamps, because these are generally manufactured only in several fixed and unchangeable lengths. One solution is to use multiple LEDs on a printed circuit board such as FR4 or metal-core printed circuit boards (MCPCBs). Multiple boards may be combined to form a limited number of combinations, but the smallest increment of length change is limited by the circuit board size. Using a shorter circuit board permits finer adjustment of length, but requires a large number of circuit boards and interconnects between circuit boards, which increases the materials and assembly expense and reduces reliability. Using a longer circuit board permits the use of a smaller number of circuit boards, but does not permit fine adjustment of the length.

Accordingly, there is a need for solutions that provide LED-based lighting systems having the ability to provide inexpensive and reliable length and shape customization with high illumination uniformity, high efficiency, and which are simple to install.

SUMMARY

Embodiments of the present invention relate to illumination systems based on flexible light sheets that have additional functionality enabled by the incorporation of at least one folded portion of the flexible light sheet. For example, illumination systems in accordance with embodiments of the invention incorporating a folded light sheet may also provide improved length customization. As utilized herein, "folding" of a light sheet includes cases in which the light sheet is only partially folded (i.e., such that opposed surfaces are not in contact or an edge of the light sheet does not come into contact with another edge of the light sheet) or completely folded (i.e., such that opposed surfaces of the light sheet do come into contact). In various embodiments of the invention, the light sheet is not folded along predefined creases or at hinges located within the light sheet; in fact, in various embodiments the light sheet is free of such predefined creases and hinges, and the light sheet may be folded at substantially any point along its lateral dimensions. (Creases and/or other artifacts of folding may be formed on the light sheet as a consequence of folding the light sheet in accordance with embodiments of the present invention, but such creases are typically not present on the light sheet before it is initially folded; such creases may at least partially remain (i.e., be detectable upon visible inspection) if the light sheet is unfolded (for, e.g., subsequent folding along a different point on the light sheet).)

In accordance with various embodiments of the invention, the flexible light sheet may be folded within or around a portion of a fixture or housing. In such embodiments, all or a portion of the housing may act as a heat sink for the folded portion of the light sheet, which typically has a higher density of light-emitting elements thereon (and concomitant heat production) due to the fold. As used herein, the terms "housing" and "fixture" broadly connote any containment structure or medium to which a light sheet may be mounted and/or for fully or partially overlying a top or bottom surface of the light sheet. A housing may be rigid or flexible, polymeric, metallic, or composed of one or more other materials (e.g., glass), and may interconnect with or be bondable to the light sheet or to another housing over the opposite surface of the light sheet to form a seal, e.g., a water-tight or water-resistant seal, around at least a portion of the light sheet.

In various embodiments of the present invention, the light sheet is folded along one or more folds that separate a portion of the light sheet containing light-emitting elements thereon from one or more additional portions of the light sheet having no light-emitting elements thereon. These one or more additional portions of the light sheet may be reflective (e.g., at least 60% reflective) to light emitted by the light-emitting elements, and/or the additional portion(s) may contain thereon at least portions of power conductors that supply power to the light-emitting elements. In this manner, the additional portion(s) may advantageously redirect light emitted by the light-emitting elements or enable the power conductors to extend beyond a planar area defined by the light-emitting element-containing portion of the light sheet and thereby have a lower resistance than if they were constrained to fit within the that planar area defined by the light-emitting element-containing portion of the light sheet.

In an aspect, embodiments of the invention feature a method of sizing a flexible light sheet. The light sheet includes or consists essentially of (i) a flexible substrate having first and second opposed surfaces and (ii) a plurality of light-emitting elements disposed over the first surface of the substrate. In a first direction along the light sheet, the substrate has an initial size larger than a desired size. A first portion of the light sheet is folded beneath a second portion of the light sheet along a line not parallel to the first direction. The line may be substantially perpendicular to the first direction. The second portion of the light sheet has the desired size. A first group of one or more of the light-emitting elements is disposed on the first portion of the light sheet and a second group of one or more of the light-emitting elements is disposed on the second portion of the light sheet. After the light sheet is folded, (i) light is emitted by both the first and second groups of light-emitting elements, and (ii) light emitted by the folded light sheet and observable to a viewer thereof comprises light emitted by the second group of one or more of the light-emitting elements but not light emitted by the first group of one or more of the light-emitting elements.

Embodiments of the invention may include one or more of the following in any of a variety of combinations. The light sheet may include a plurality of conductive traces disposed on the substrate and electrically interconnecting the plurality of light-emitting elements into a plurality of light-emitting strings. The light-emitting elements may be spaced apart at a light-emitting-element pitch in the first direction. The light-emitting strings may be spaced apart at a string pitch, in the first direction, that is greater than the light-emitting-element pitch. The desired size along the first direction may not be an integral multiple of the string pitch. The light sheet may be cut along a cut line disposed between first and second light-emitting strings, thereby removing the second light-emitting string and reducing the light sheet to an intermediate size larger than the desired size. After the light sheet is folded, a first portion of the first light-emitting string may be disposed on the first portion of the light sheet and a second portion of the first light-emitting string may be disposed on the second portion of the light sheet. The light sheet may include one or more power conductors thereon, the one or more power conductors providing power to the light-emitting strings. After the light sheet is folded, the second surface of the first portion of the light sheet may be adjacent to (i.e., in close proximity to but not necessarily in contact with) the second surface of the second portion of the light sheet. After the light sheet is folded, at least a portion of the second surface of the first portion of the light sheet may be in contact with (i.e., in direct mechanical contact with) at least a portion of the second surface of the second portion of the light sheet. After folding the light sheet, at least a portion of the second surface of the first portion of the light sheet may be adhered to (i.e., attached to with an adhesive) at least a portion of the second surface of the second portion of the light sheet. After folding the light sheet, at least a portion of the second surface of the first portion of the light sheet may be mechanically fastened to at least a portion of the second surface of the second portion of the light sheet.

A material may be disposed only (i) over at least a portion of the first portion of the light sheet and/or (ii) between the first and second portions of the light sheet. The material may have a thermal conductivity greater (e.g., at least 2 times greater, at least 5 times greater, at least 10 times greater, or at least 100 times greater) than a thermal conductivity of the substrate. The material may include or consist essentially of metal, plastic, tape, adhesive, glue, and/or fabric. A cover may be disposed over at least a portion of (e.g., only a portion of) the first portion of the light sheet to substantially block emission of light therefrom. A cover may be disposed over an entirety of the first portion of the light sheet to substantially block emission of light therefrom. At least a portion of the substrate has a reflectance greater than 60%, greater than 70%, greater that 80%, or greater than 90%, to a wavelength of light emitted by a light-emitting element. A portion of the substrate disposed between light-emitting elements has a reflectance greater than 60%, greater than 70%, greater that 80%, or greater than 90%, to a wavelength of light emitted by a light-emitting element. One or more conductive elements may be disposed on the portion of the substrate disposed between light-emitting elements.

A fixture having a length along the first direction may be provided. The length of the fixture may be less than the initial size of the light sheet (i.e., the size of the light sheet in an unfolded configuration). After the light sheet is folded, the desired size of the second portion of the light sheet may be no greater than (e.g., substantially equal to) the length of the fixture. After the light sheet is folded, the first group of one or more of the light-emitting elements may emit light in a second direction. After the light sheet is folded, the second group of one or more of the light-emitting elements may emit light in a third direction different from the second direction. The third direction may be substantially perpendicular to the first surface of the light sheet. No portion of the fixture may be disposed between the first and second portions of the light sheet after the light sheet is folded. A portion of the fixture may be disposed between the first and second portions of the light sheet after the light sheet is folded. The portion of the fixture disposed between the first and second portions of the light sheet may have a thermal conductivity greater (e.g., at least 2 times greater, at least 5 times greater, at least 10 times greater, or at least 100 times greater) than the thermal conductivity of the substrate. At least a portion of the second portion of the light sheet may be attached (e.g., adhered and/or mechanically fastened) to the fixture.

The light sheet may include a plurality of conductive traces disposed on the substrate and electrically interconnecting the plurality of light-emitting elements into a plurality of light-emitting strings. The light-emitting elements may be spaced apart at a light-emitting-element pitch in the first direction. The light-emitting strings may be spaced apart at a string pitch, in the first direction, that is different from (e.g., greater than) the light-emitting-element pitch. The desired size along the first direction may not be an integral multiple of the string pitch. The light sheet may be cut along a cut line disposed between first and second light-emitting strings, thereby removing the second light-emitting string and reducing the light sheet to an intermediate size larger than the desired size. After the light sheet is folded, a first portion of the first light-emitting string may be disposed on the first portion of the light sheet and a second portion of the first light-emitting string may be disposed on the second portion of the light sheet. A cover may be disposed over at least a portion of (e.g., only a portion of) the first portion of the light sheet to substantially block emission of light therefrom. A cover may be disposed over an entirety of the first portion of the light sheet to substantially block emission of light therefrom. At least a portion of the substrate may have a reflectance greater than 60%, greater than 70%, greater that 80%, or greater than 90%, to a wavelength of light emitted by a light-emitting element. After folding, at least portions of the first and second portions of the light sheet may be substantially parallel.

In another aspect, embodiments of the invention feature an illumination device that includes or consists essentially of a flexible light sheet that is substantially planar in an unfolded configuration. The light sheet includes or consists essentially of (i) a flexible substrate having first and second opposed surfaces and (ii) a plurality of light-emitting elements disposed over the first surface of the substrate. The light sheet is folded along a fold dividing a first portion of the light sheet from a second portion of the light sheet. The first portion of the light sheet includes a first group of one or more of the light-emitting elements disposed thereon. The second portion of the light sheet includes a second group of one or more of the light-emitting elements disposed thereon. Proximate the fold, (a) the first portion of the light sheet is disposed beneath the second portion of the light sheet, (b) the first group of one or more of the light-emitting elements emits light in a first direction, and (c) the second group of one or more of the light-emitting elements emits light in a second direction different from the first direction. Light is emitted by both the first and second groups of light-emitting elements. Light emitted from the folded light sheet and observable to a viewer thereof includes or consists essentially of light emitted by the second group of one or more of the light-emitting elements but not light emitted by the first group of one or more of the light-emitting elements.

Embodiments of the invention may include one or more of the following in any of a variety of combinations. A plurality of conductive traces may be disposed on the substrate and may electrically interconnect the plurality of light-emitting elements into a plurality of light-emitting strings. The light-emitting elements may be spaced apart at a light-emitting-element pitch in a third direction along the light sheet. The light-emitting strings may be spaced apart, in the third direction, at a string pitch that is different from (e.g., greater than) the light-emitting-element pitch. Proximate the fold, a first portion of a first light-emitting string may be disposed on the first portion of the light sheet and a second portion of the first light-emitting string may be disposed on the second portion of the light sheet. The second surface of the first portion of the light sheet may be adjacent to the second surface of the second portion of the light sheet. At least a portion of the second surface of the first portion of the light sheet may be in contact with at least a portion of the second surface of the second portion of the light sheet. At least a portion of the second surface of the first portion of the light sheet may be adhered to at least a portion of the second surface of the second portion of the light sheet. At least a portion of the first portion of the light sheet may be mechanically fastened to at least a portion of the second portion of the light sheet. At least portions of the first and second portions of the light sheet may be substantially parallel.

A material may be disposed only (i) over at least a portion of the first portion of the light sheet and/or (ii) between the first and second portions of the light sheet. The material may have a thermal conductivity greater (e.g., at least 2 times greater, at least 5 times greater, at least 10 times greater, or at least 100 times greater) than a thermal conductivity of the substrate. The material may include or consist essentially of metal, plastic, tape, adhesive, glue, and/or fabric. A cover may be disposed over at least a portion of (e.g., only a portion of) the first portion of the light sheet to substantially block emission of light therefrom. A cover may be disposed over an entirety of the first portion of the light sheet to substantially block emission of light therefrom. At least a portion of the substrate may have a reflectance greater than 60% to a wavelength of light emitted by a light-emitting element. The light sheet may be disposed on a fixture. A combined length of the first and second portions of the light sheet may be longer than a length of the fixture. The second portion of the light sheet may have a length no greater than the length of the fixture. No portion of the fixture may be disposed between the first and second portions of the light sheet. A portion of the fixture may be disposed between the first and second portions of the light sheet. The portion of the fixture disposed between the first and second portions of the light sheet may have a thermal conductivity greater (e.g., at least 2 times greater, at least 5 times greater, at least 10 times greater, or at least 100 times greater) than a thermal conductivity of the substrate. At least a portion of the second portion of the light sheet may be attached (e.g., adhered and/or mechanically fastened) to the fixture. A plurality of conductive traces may be disposed on the substrate and may electrically interconnect the plurality of light-emitting elements into a plurality of light-emitting strings. The light-emitting elements may be spaced apart at a light-emitting-element pitch in a third direction along the light sheet. The light-emitting strings may be spaced apart, in the third direction, at a string pitch that is different from (e.g., greater than) the light-emitting-element pitch. Proximate the fold, a first portion of a first light-emitting string may be disposed on the first portion of the light sheet and a second portion of the first light-emitting string may be disposed on the second portion of the light sheet. A cover may be disposed over at least a portion of (e.g., only a portion of) the first portion of the light sheet to substantially block emission of light therefrom. A cover may be disposed over an entirety of the first portion of the light sheet to substantially block emission of light therefrom. At least a portion of the substrate may have a reflectance greater than 60% to a wavelength of light emitted by a light-emitting element.

In yet another aspect, embodiments of the invention feature an illumination device that includes or consists essentially of a flexible light sheet that is substantially planar in an unfolded configuration. The light sheet includes or consists essentially of (i) a flexible substrate having first and second opposed surfaces and (ii) a plurality of light-emitting elements disposed over the first surface of the substrate. The light sheet is folded along a first fold dividing a first portion of the light sheet from a second portion of the light sheet, whereby the first fold defines a non-zero angle between the first and second portions of the light sheet. Light-emitting elements are disposed on the first portion of the light sheet. No light-emitting elements are disposed on the second portion of the light sheet. The second portion of the light sheet has a reflectance greater than 60% (or greater than 70%, or greater than 80%, or greater than 90%, or greater than 95%) to a wavelength of light emitted by a light-emitting element, and/or the second portion of the light sheet includes a power conductor thereon, the power conductor providing power to the light-emitting elements.

Embodiments of the invention may include one or more of the following in any of a variety of combinations. The second portion of the light sheet may have a reflectance greater than 60% (or greater than 70%, or greater than 80%, or greater than 90%, or greater than 95%) to a wavelength of light emitted by a light-emitting element. The second portion of the light sheet may include the power conductor thereon. At least portions of the first and second portions of the light sheet may be substantially parallel. The light sheet may be folded along a second fold dividing the first portion of the light sheet from a third portion of the light sheet different from the second portion of the light sheet, whereby the second fold defines a non-zero angle between the first and third portions of the light sheet. No light-emitting elements may be disposed on the third portion of the light sheet. At least portions of the first and third portions of the light sheet may be substantially parallel. The third portion of the light sheet may have a reflectance greater than 60% (or greater than 70%, or greater than 80%, or greater than 90%, or greater than 95%) to a wavelength of light emitted by a light-emitting element. The second and third portions of the light sheet may be disposed at opposite ends of the light sheet. The first portion of the light sheet may be disposed between the second and third portions of the light sheet. The third portion of the light sheet may include a second power conductor thereon, the second power conductor providing power to the light-emitting elements. The light-emitting elements may be interconnected to form one or more light-emitting strings. A first end of each light-emitting string may be electrically coupled to the power conductor, and/or a second end of each light-emitting string may be electrically coupled to the second power conductor. The light sheet may be folded along a third fold dividing the first portion of the light sheet from a fourth portion of the light sheet. The first portion of the light sheet may include a first group of one or more of the light-emitting elements disposed thereon. The fourth portion of the light sheet may include a second group of one or more of the light-emitting elements disposed thereon. Proximate the fold, (a) the fourth portion of the light sheet may be disposed beneath the first portion of the light sheet, (b) the first group of one or more of the light-emitting elements may emit light in a first direction, and (c) the second group of one or more of the light-emitting elements may emit light in a second direction different from the first direction. Light may be emitted by both the first and second groups of light-emitting elements. Light emitted from the folded light sheet (i.e., the light sheet folded along the third fold) and observable to a viewer thereof may include or consist essentially of light emitted by the first group of one or more of the light-emitting elements but not light emitted by the second group of one or more of the light-emitting elements. At least portions of the first and fourth portions of the light sheet may be substantially parallel.

In another aspect, embodiments of the invention feature an illumination device that includes or consists essentially of a flexible light sheet that is substantially planar in an unfolded configuration. The light sheet includes or consists essentially of (i) a flexible substrate having first and second opposed surfaces, (ii) a plurality of light-emitting elements disposed over the first surface of the substrate, and (iii) a plurality of conductive traces disposed on the substrate and electrically interconnecting the plurality of light-emitting elements into a plurality of light-emitting strings. In a first direction along the light sheet, (i) light-emitting elements are spaced apart at a light-emitting-element pitch and (ii) light-emitting strings are spaced apart at a string pitch that is greater than the light-emitting-element pitch. The light sheet is folded along a fold (i) not parallel to the first direction and (ii) disposed between first and second portions of the light sheet. Proximate the fold, (a) the first portion of the light sheet is disposed beneath the second portion of the light sheet, (b) light-emitting elements on the first portion of the light sheet emit light in a second direction, and (c) light-emitting elements on the second portion of the light sheet emit light in a third direction different from the second direction. Proximate the fold, a first portion of a first light-emitting string is disposed on the first portion of the light sheet and a second portion of the first light-emitting string is disposed on the second portion of the light sheet. At least portions of the first and second portions of the light sheet may be substantially parallel.

In another aspect, embodiments of the invention feature a method of sizing a flexible light sheet having an initial size to a desired size smaller than the initial size. The light sheet includes or consists essentially of (i) a flexible substrate having first and second opposed surfaces, (ii) a plurality of light-emitting elements disposed over the first surface of the substrate, and (iii) a plurality of conductive traces disposed on the substrate and electrically interconnecting the plurality of light-emitting elements into a plurality of light-emitting strings. In a first direction along the light sheet, (i) light-emitting elements are spaced apart at a light-emitting-element pitch and (ii) light-emitting strings are spaced apart at a string pitch that is greater than the light-emitting-element pitch. The desired size along the first direction is not an integral multiple of the string pitch. The light sheet is cut along a cut line disposed between first and second light-emitting strings, thereby removing the second light-emitting string and reducing the light sheet to an intermediate size larger than the desired size. A first portion of the light sheet is folded beneath a second portion of the light sheet. The second portion of the light sheet has the desired size. A first portion of the first light-emitting string is disposed on the first portion of the light sheet and a second portion of the first light-emitting string is disposed on the second portion of the light sheet. After folding, at least portions of the first and second portions of the light sheet may be substantially parallel.

In yet another aspect, embodiments of the invention feature an illumination device that includes or consists essentially of a heat sink and a flexible light sheet that is substantially planar in an unfolded configuration. The light sheet includes or consists essentially of (i) a flexible substrate having first and second opposed surfaces, and (ii) a plurality of light-emitting elements disposed over the first surface of the substrate. The light sheet may include a plurality of conductive traces disposed on the substrate and electrically interconnecting the plurality of light-emitting elements. The light sheet is folded along a fold disposed between (i.e., defining) first and second portions of the light sheet. Proximate the fold, (a) the first portion of the light sheet is disposed beneath the second portion of the light sheet, (b) light-emitting elements on the first portion of the light sheet emit light in a first direction, and (c) light-emitting elements on the second portion of the light sheet emit light in a second direction different from the first direction. The heat sink is disposed proximate the fold. The heat sink is disposed only (i) over the first portion of the light sheet and/or (ii) between the first and second portions of the light sheet. At least portions of the first and second portions of the light sheet may be substantially parallel.

In another aspect, embodiments of the invention feature a method of forming an illumination device. A flexible light sheet that is substantially planar in an unfolded configuration is provided. The light sheet includes or consists essentially of (i) a flexible substrate having first and second opposed surfaces, and (ii) a plurality of light-emitting elements disposed over the first surface of the substrate. The light sheet may include a plurality of conductive traces disposed on the substrate and electrically interconnecting the plurality of light-emitting elements. A first portion of the light sheet is folded under a second portion of the light sheet. Light-emitting elements on the first portion of the light sheet emit light in a first direction. Light-emitting elements on the second portion of the light sheet emit light in a second direction different from the first direction. A heat sink is placed in thermal contact with light-emitting elements on the first and second portions of the light sheet. The heat sink is disposed only (i) over the first portion of the light sheet and/or (ii) between the first and second portions of the light sheet. After folding, at least portions of the first and second portions of the light sheet may be substantially parallel.

In yet another aspect, embodiments of the invention feature an illumination device that includes or consists essentially of a cover and a flexible light sheet that is substantially planar in an unfolded configuration. The light sheet includes or consists essentially of (i) a flexible substrate having first and second opposed surfaces, and (ii) a plurality of light-emitting elements disposed over the first surface of the substrate. The light sheet may include a plurality of conductive traces disposed on the substrate and electrically interconnecting the plurality of light-emitting elements. The light sheet is folded along a fold disposed between first and second portions of the light sheet. Proximate the fold, (a) the first portion of the light sheet is disposed beneath the second portion of the light sheet, (b) light-emitting elements on the first portion of the light sheet emit light in a first direction, and (c) light-emitting elements on the second portion of the light sheet emit light in a second direction different from the first direction. The cover is disposed proximate the fold. The cover is disposed only over the first portion of the light sheet to substantially block emission of light therefrom. At least portions of the first and second portions of the light sheet may be substantially parallel.

In another aspect, embodiments of the invention feature a method of forming an illumination device. A flexible light sheet that is substantially planar in an unfolded configuration is provided. The light sheet includes or consists essentially of (i) a flexible substrate having first and second opposed surfaces, and (ii) a plurality of light-emitting elements disposed over the first surface of the substrate. The light sheet may include a plurality of conductive traces disposed on the substrate and electrically interconnecting the plurality of light-emitting elements. A first portion of the light sheet is folded under a second portion of the light sheet. Each of the first and second portions of the light sheet has light-emitting elements thereon. Light-emitting elements on the first portion of the light sheet emit light in a first direction. Light-emitting elements on the second portion of the light sheet emit light in a second direction different from the first direction. A cover is disposed only over the first portion of the light sheet to substantially block emission of light therefrom. After folding, at least portions of the first and second portions of the light sheet may be substantially parallel.

In yet another aspect, embodiments of the invention feature a method of forming an illumination device. A fixture having a length along a first direction is provided. A flexible light sheet having a length along the first direction longer than the length of the fixture is disposed on the fixture. The light sheet includes or consists essentially of (i) a flexible substrate having first and second opposed surfaces, and (ii) a plurality of light-emitting elements disposed over the first surface of the substrate. The light sheet may include a plurality of conductive traces disposed on the substrate and electrically interconnecting the plurality of light-emitting elements. A first portion of the light sheet is folded under a second portion of the light sheet. The second portion of the light sheet has a length no greater than the length of the fixture. Each of the first and second portions of the light sheet has light-emitting elements thereon. Light-emitting elements on the first portion of the light sheet emit light in a first direction. Light-emitting elements on the second portion of the light sheet emit light in a second direction different from the first direction. A portion of the fixture may be disposed between the first and second portions of the light sheet (i.e., the light sheet may be folded so as to wrap around a portion of the fixture). No portion of the fixture may be disposed between the first and second portions of the light sheet (i.e., the light sheet may be folded so as not to wrap around a portion of the fixture). After folding, at least portions of the first and second portions of the light sheet may be substantially parallel.

In another aspect, embodiments of the invention feature an illumination device that includes or consists essentially of a fixture having a length along a first direction, and, disposed on the fixture, a flexible light sheet having a length along the first direction longer than the length of the fixture. The light sheet includes or consists essentially of (i) a flexible substrate having first and second opposed surfaces, and (ii) a plurality of light-emitting elements disposed over the first surface of the substrate. The light sheet may include a plurality of conductive traces disposed on the substrate and electrically interconnecting the plurality of light-emitting elements. A first portion of the light sheet is folded under a second portion of the light sheet. The second portion of the light sheet has a length no greater than the length of the fixture. Each of the first and second portions of the light sheet has light-emitting elements thereon. Light-emitting elements on the first portion of the light sheet emit light in a first direction. Light-emitting elements on the second portion of the light sheet emit light in a second direction different from the first direction. A portion of the fixture may be disposed between the first and second portions of the light sheet (i.e., the light sheet may be folded so as to wrap around a portion of the fixture). No portion of the fixture may be disposed between the first and second portions of the light sheet (i.e., the light sheet may be folded so as not to wrap around a portion of the fixture). At least portions of the first and second portions of the light sheet may be substantially parallel.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. As used herein, the terms "about," "approximately," and "substantially" mean±10%, and in some embodiments, ±5%. The term "consists essentially of" means excluding other materials that contribute to function, unless otherwise defined herein. Nonetheless, such other materials may be present, collectively or individually, in trace amounts.

Herein, two components such as light-emitting elements and/or optical elements being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other. Substrates, light sheets, components, and/or portions thereof described as "reflective" may be specularly reflective or diffusively reflective unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
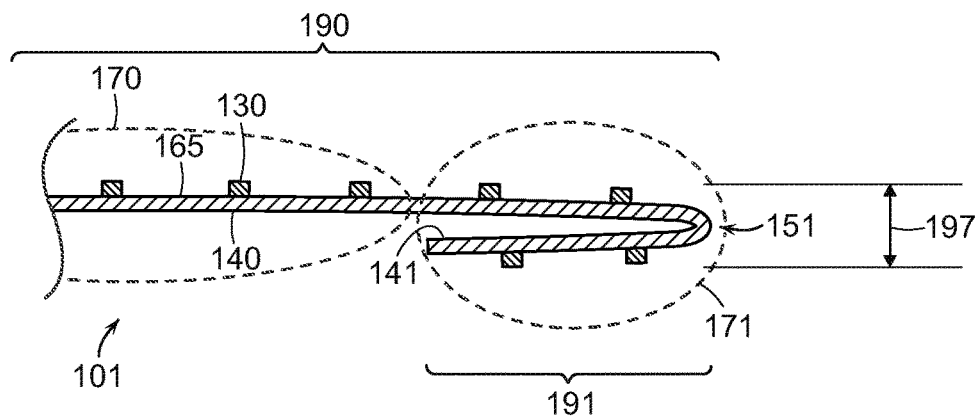
FIGS. 1A-1C are cross-sectional schematics of light sheets in accordance with various embodiments of the invention.

Exemplary lighting systems in accordance with embodiments of the present invention include or consist essentially of one or more flexible light sheets on which are formed an array of light-emitting elements (LEEs), each of which may include or consist essentially of, for example, a bare-die or a packaged light-emitting diode (LED). The flexible light sheets are folded one or more times to modify the length, width, and/or shape of the resulting lighting system. FIG. 1A depicts an exemplary light sheet 101, in accordance with embodiments of the present invention, which features LEEs 130 formed on a substrate 165. Light sheet 101 includes a first portion 190 and a second portion 191 separated by a fold 151. In various embodiments, conductive elements may be formed on substrate 165 that electrically couple two or more LEEs 130; however, these are not shown in FIG. 1A for clarity and will be discussed in more detail herein. While FIG. 1A shows second portion 191 having two (or two rows of) LEEs 130, this is not a limitation of the present invention, and in other embodiments second portion 191 may have one (or one row of) LEE 130 or more than two (or more than two rows of) LEEs 130.

Figure 1B:
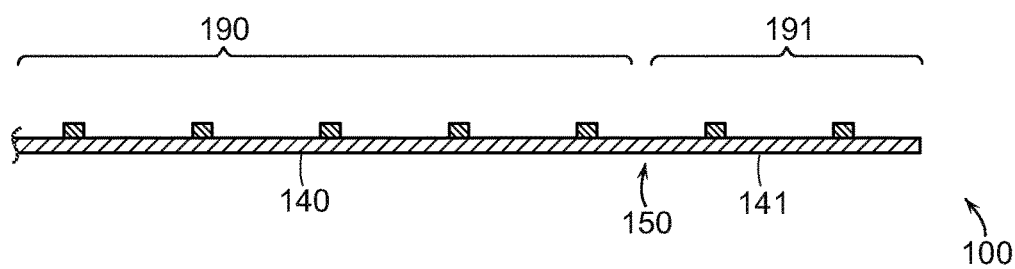

FIG. 1B shows the structure of FIG. 1A at an earlier stage of manufacture, prior to formation of fold 151. The structure of FIG. 1A is formed by starting with an unfolded light sheet 100 and folding light sheet 100 at a fold position 150, forming fold 151 such that all or a portion of a back side 140 of substrate 165 in first portion 190 is adjacent to and substantially parallel to a back side 141 of substrate 165 in second portion 191. While FIG. 1A shows back side 141 as spaced apart from back side 140, this is not a limitation of the present invention, and in other embodiments back side 140 may be in contact with or substantially in contact with back side 141. In various embodiments, fold 151 is a 180° or back-to-back (or "complete") fold; in other words, light sheet 100 is folded by approximately 180° at fold position 150, resulting in back-to-back portions of the light sheet in a folded region 171. Light sheet 101 also includes an unfolded region 170, as shown in FIG. 1A. Folded region 171 includes at least a portion of first portion 190 and second portion 191, while unfolded region 170 includes only a portion of first portion 190.

Although not shown in FIG. 1A, in various embodiments light sheet 101 at fold 151 includes portions of one or more conductive elements used to electrically couple and/or power LEEs 130 and/or to provide or convey communication or control signals to LEEs 130 and/or light sheet 101. Various embodiments of the present invention include or consist essentially of one or more sufficiently flexible light sheets, for example including substrate materials and conductive element materials, to permit folding and/or creasing, e.g., folding of the element over on itself (for example folding a portion of the element through substantially 180°)

such that the folded portion is adjacent to or lays on and is substantially parallel to the non-folded portion without impairing or substantially impairing the functionality of the light sheet (e.g., without impairing or substantially impairing the conductive traces on the substrate and/or the functionality of the LEES or the substrate). For example, in one embodiment, the functionality of the conductive trace may include a resistance or conductance value, a reliability metric, a mechanical metric, or the like. For example, in one embodiment, the functionality of the substrate may include a resistance value, a reliability metric, a mechanical metric, or the like. In some embodiments, a folded or creased light sheet may have a radius of curvature of less than 2 mm, or less than 1 mm, or less than 0.05 mm. In various embodiments of the present invention, the light sheet may be folded or creased without damage or substantial damage to the light sheet, for example to the substrate and/or conductive traces. In various embodiments of the present invention, the light sheet may be folded or creased without changing or substantial changing the electrical and/or mechanical and/or thermal and/or optical properties of the light sheet.

In various embodiments of the present invention, folding of the light sheet does not create unwanted short-circuits (or "shorts") or open-circuits (or "opens") in the conductive elements formed on substrate 165. In preferred embodiments of the present invention, folding of the light sheet does not reduce the functionality or damage or create damage in LEEs 130 or any other components that may be formed on substrate 165, nor does folding of the light sheet impair or damage or destroy the attachment of LEEs 130 or any other components to the light sheet (for example to conductive elements on substrate 165).

In various embodiments, flexible light sheets have a Young's Modulus less than about $50\times10^9$ N/m$^2$, less than about $10\times10^9$ N/m$^2$, or even less than about $5\times10^9$ N/m$^2$. In various embodiments, flexible light sheets have a Shore A hardness value less than about 100; a Shore D hardness less than about 100; and/or a Rockwell hardness less than about 150.

Figure 1C:
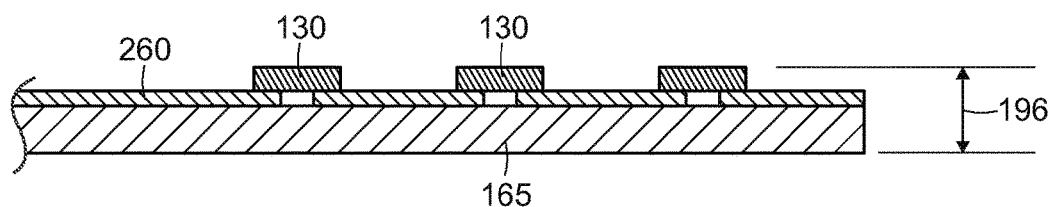

FIG. 1C shows a cross-sectional view of light sheet 100 that includes or consists essentially of substrate 165 over which have been formed conductive elements 260 and LEEs 130. A light sheet thickness 196 is defined as the distance between the bottom surface of the light sheet substrate and the top surface of the tallest component (in some embodiments the tallest component may be an LEE 130; however, this is not a limitation of the present invention, and in other embodiments the height may be determined by another component). In some embodiments of the present invention, light sheet thickness 196 is less than about 10 mm, less than about 5 mm, less than about 2 mm, or less than about 1 mm. In some embodiments, the thickness of a folded light sheet 101, for example thickness 197 (FIG. 1A) is less than about 10×t, less than about 5×t, less than about 3×t, less than about 2×t, or less than about 1.5×t, where t is light sheet thickness 196. In one example, light sheet 100 has a thickness 196 of about 1.5 mm and folded light sheet 101 has a thickness 197 of about 3 mm to about 5 mm.

Figure 2A:
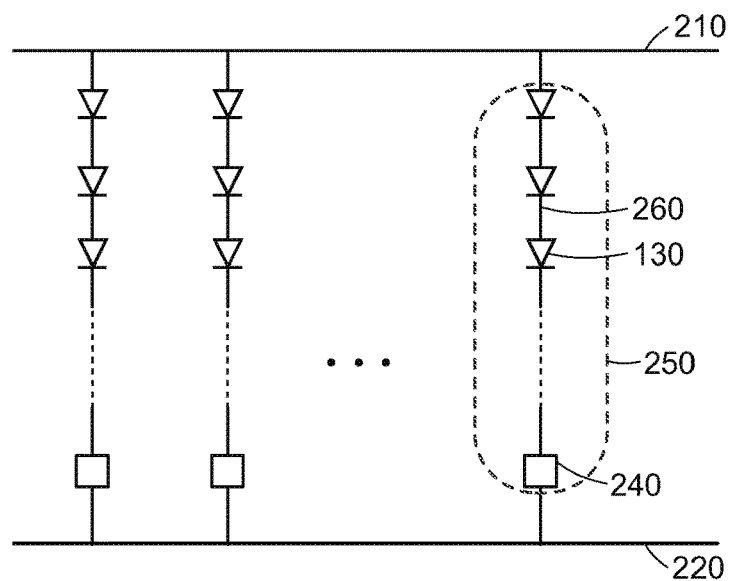
FIG. 2A is a partial circuit diagram of an illumination system in accordance with various embodiments of the invention.
Figure 2B:
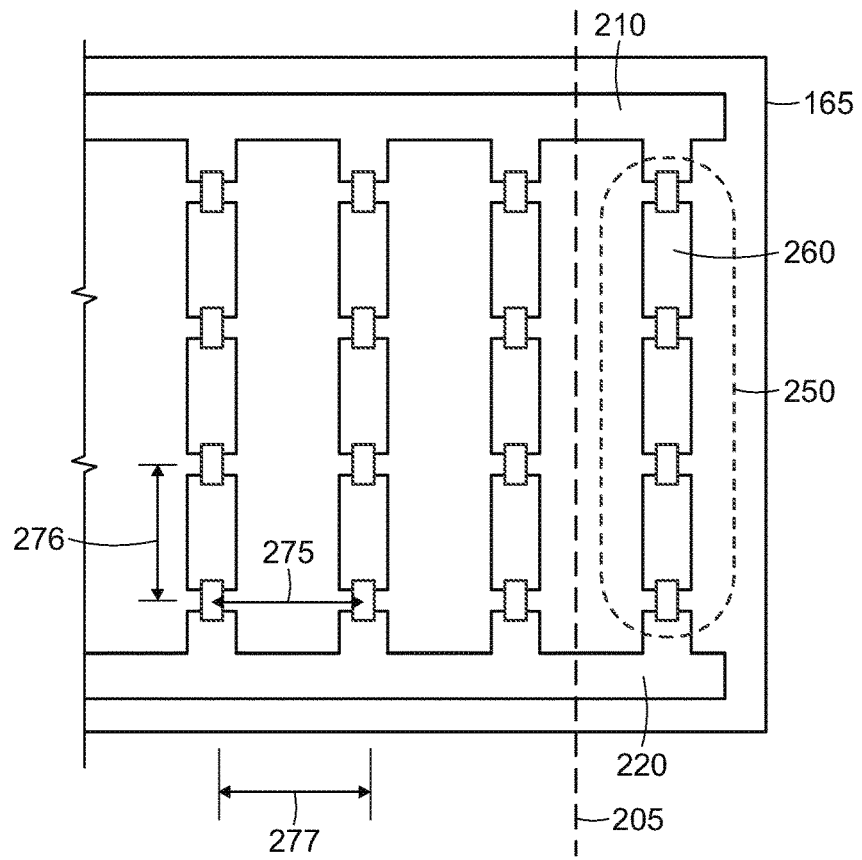
FIGS. 2B and 2C are partial schematics of light sheets in accordance with various embodiments of the invention.
Figure 2C:
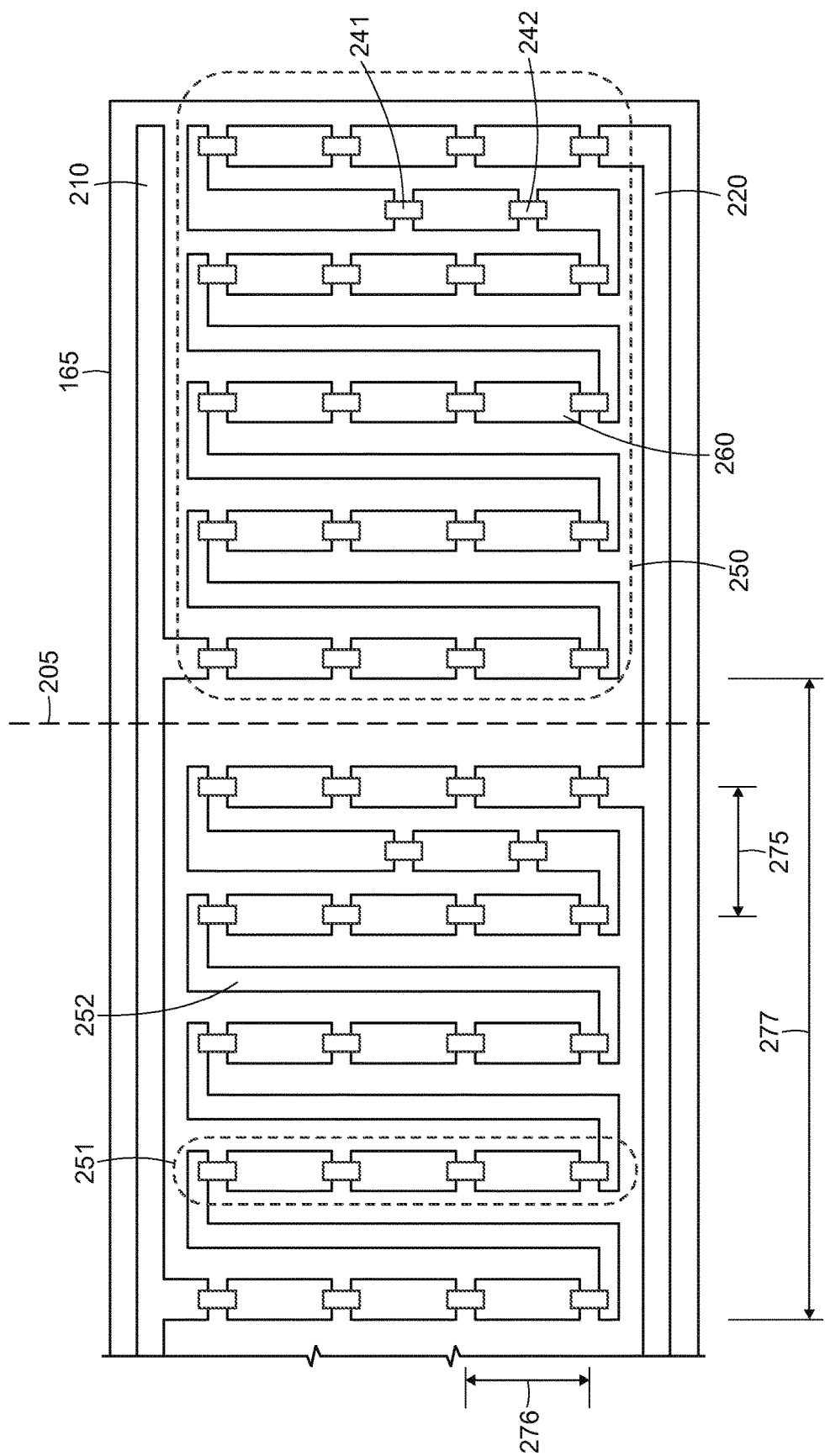

FIGS. 2A-2C show exemplary schematics or electrical schematics of unfolded light sheets in accordance with embodiments of the present invention, and which are described in detail in U.S. Pat. No. 8,786,200, filed on Apr. 5, 2013 ("the '200 patent"), and U.S. Pat. No. 8,704,448, filed on Aug. 19, 2013 ("the '448 patent"), the entire disclosures of which are incorporated by reference herein, although alternative systems and light sheets with similar functionality are also within the scope of the invention.

FIG. 2A shows a portion of an exemplary electrical schematic of an unfolded light sheet including or consisting essentially of an array of light-emitting strings 250 and power conductors 210, 220 providing power to the light-emitting strings (or simply "strings") 250. Each string 250 may include or consist essentially of one or more LEEs 130, each electrically coupled with conductive traces 260. LEEs 230 in string 250 may be electrically coupled in series, as shown in FIG. 2A; however, this is not a limitation of the present invention, and in other embodiments other examples of electrical coupling may be utilized, for example LEEs coupled in parallel or coupled in any combination of series and parallel connections. FIG. 2A shows current control elements (CEs) 240, which may be used to set, regulate or control the current in each string, in series with LEEs 130 in each string 250; however, this is not a limitation of the present invention, and in other embodiments CEs 240 may have different electrical coupling between power conductors 210, 220, or may be absent altogether. For example, in some embodiments a CE 240 may be separately electrically coupled to power conductors 210, 220 and to the LEE string 250, while in other embodiments each CE 240 may be electrically coupled to two or more strings. The number of strings electrically coupled to each CE 240 is not a limitation of the present invention. While FIG. 2A shows one CE 240 per string 250, this is not a limitation of the present invention, and in other embodiments more than one CE 240 may be incorporated within each string 250, or string 250 may have no CEs 240. Each CE 240 may include or consist essentially of, for example, one or more resistors or one or more resistors and one or more transistors. In some embodiments, one or more electrical connections may be formed between LEEs 130 of different strings. Combinations of structures described herein, as well as other electrical connections, all fall within the in the scope of the present invention. Power conductors 210, 220 may be used to provide power to strings 250, for example AC power, DC power, or power modulated by any other means. The number of LEEs 130 per string 250 and the number of strings 250 are not limitations of the present invention.

FIG. 2B shows a portion of an exemplary light sheet having a straight string 250, while FIG. 2C shows a schematic of a light sheet having a serpentine or folded string (note that a folded string is different than a folded sheet; folded strings are "folded" in the sense that they change linear direction one or more times within the plane of the light sheet). In the exemplary embodiment depicted in FIG. 2B, power conductors 210, 220 are spaced apart from each other and light-emitting strings 250 are connected between power conductors 210, 220. While FIG. 2B shows four LEEs 130 per string 250, this is not a limitation, and in other embodiments each string 250 may include fewer LEEs 130 or more LEEs 130. In some embodiments, for example as shown in FIG. 2B, strings 250 do not cross (i.e., intersect) each other. In other words, power conductors 210, 220 are oriented in one direction and strings 250 are oriented such that they span power conductors 210, 220 in a different direction. As shown in FIG. 2B, strings 250 are substantially perpendicular to power conductors 210, 220. However, this is not a limitation of the present invention, and in other embodiments at least some segments (i.e., portions connecting two or more LEEs 230), or even the entire strings 250, may define a line (not necessarily a straight line) that is not perpendicular to power conductors 210, 220 yet is (at least for an entire string 250) not parallel to power conductors 210, 220. In other embodiments, strings 250 may intersect, for example one string 250 splitting into two or more strings 250, or two or more strings 250 joining to form a reduced number of strings 250. In some embodiments, conductive elements 260 may cross over each other without being electrically coupled (e.g., they may be separated by an insulating material therebetween), and in some embodiments strings 250 may cross over or under each other without being electrically coupled. In some embodiments, all or a portion of one or more strings 250 may extend outside of the area spanned and/or defined by power conductors 210, 220. Various examples of string geometries and conformations utilized in embodiments of the present invention are detailed in the '200 and '448 patents.

In FIG. 2B, LEEs 130 are positioned in a square array having a LEE spacing or pitch in horizontal or length direction 275, a LEE spacing or pitch in the vertical or width direction 276 and a string spacing or pitch 277. In the example shown in FIG. 2B, the horizontal LEE pitch 275 is the same as or substantially the same as a vertical LEE pitch 276; however, this is not a limitation of the present invention, and in other embodiments the horizontal LEE pitch 275 is different from the vertical LEE pitch 276. In the example shown in FIG. 2B, LEEs 130 are positioned in a square array; however, this is not a limitation of the present invention, and in other embodiments LEEs 130 may be positioned in a rectangular array, a triangular array, a hexagonal array, or any other regular or periodic array, or in any random positions.

In the example shown in FIG. 2B, the string pitch 277 is the same or substantially the same as the horizontal LEE pitch 275; however, this is not a limitation of the present invention, as will be discussed herein. The light sheet shown in FIG. 2B is similar to the electrical schematic in FIG. 0.2A; however, in the light sheet of FIG. 2B, each string includes or consists essentially of four LEEs 130 and no CE 240; however, this is not a limitation of the present invention, and in other embodiments each string 250 may have fewer or more than four LEEs 130, and/or may include one or more CEs 240. One end of string 250 is electrically coupled to power conductor 210, while the other end of string 250 is electrically coupled to power conductor 220. As discussed herein, the number of segments in a string 250 is not a limitation of the present invention.

The light sheet shown schematically in FIG. 2C is similar to that depicted in FIG. 2B; however, in the structure of FIG. 2C the strings have a serpentine or folded string configuration, i.e., the physical geometry of the string snakes or folds back and forth to fit between power conductors 210 and 220. In this configuration, the string pitch 277 is larger than the horizontal LEE pitch 275. A serpentine or folded string is a string that has multiple LEEs 130 electrically coupled in series but positioned in multiple segments, i.e., not in a single line. A string segment may be defined as a portion of a string that may, but does not necessarily, extend in one direction different from one or more directions along which other string segments in a string extend. In some embodiments, a string segment may include one or more LEEs 230, for example string segment 251 in FIG. 2C, while in other embodiments a string segment may include no LEEs 130 and/or no other active components, for example string segment 252 in FIG. 2C. In other embodiments the distribution and position of LEEs 230 along conductive elements 260 and string segments may be different. In some embodiments, a string 250 may be a straight string, i.e., a string with no folds, as shown in FIG. 2B. (The example shown in FIG. 2B does not include CE 240.) Various examples of straight and serpentine (or "folded") strings utilized in embodiments of the present invention are detailed in the '200 and '448 patents.

The width of a light sheet (in the direction of vertical pitch 276) having a straight string is in part determined by the number of LEEs 130 per string and the vertical pitch 276. For example, if string 250 includes 20 LEEs and vertical pitch 276 is about 10 mm, then the illuminated light sheet width is about 190 mm. Narrower width light sheets may be fabricated by utilizing serpentine or folded strings. For example, if the desired illuminated sheet width is about 30 mm and there are 20 LEEs per string and the vertical LEE pitch 276 is about 10 mm, this would require a serpentine string with five LEE-containing string elements 251, similar to the configuration depicted in FIG. 2C. In this example string pitch 277 is about five times as large as the horizontal LEE pitch 275.

In the example shown in FIG. 2C, CE 240 includes or consists essentially of two components 241 and 242; however, this is not a limitation of the present invention, and in other embodiments CE 240 may include or consist essentially of fewer or more components. In some embodiments CE 240 may include or consist essentially of two transistors and two resistors. In some embodiments, CE 240 may include or consist essentially of one integrated circuit and one resistor. Various configurations of CEs 240 are described in the '200 and '448 patents.

Figure 2D:
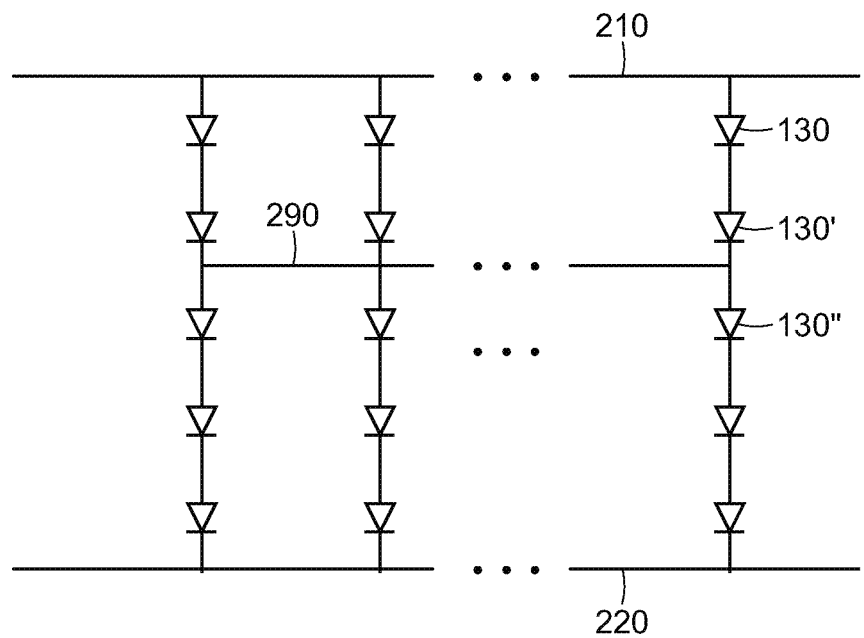
FIGS. 2D and 2E are partial circuit diagrams of illumination systems in accordance with various embodiments of the invention.
Figure 2E:
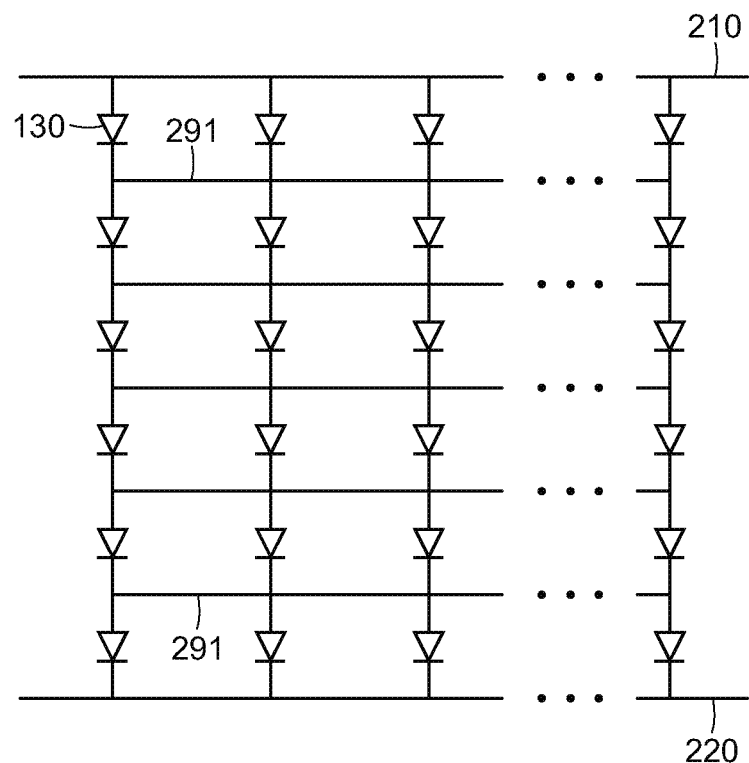

While much of the discussion herein is related to light sheets as described in '200 and '448 patents, this is not a limitation of the present invention, and in other embodiments other light-emitting systems may be utilized with aspects of this invention. For example, in some embodiments, a light sheet populated with LEEs may be replaced with a sheet of one or more organic LEDs (OLEDs). In another embodiment of the present invention, the light sheet may include LEEs 130 that are partially or fully interconnected between strings, as described in U.S. Pat. No. 8,384,114, filed on Feb. 29, 2012, the entire disclosure of which is incorporated by reference herein. For example, FIG. 2D shows an example of a light sheet in which a conductive connector 290 provides electrical coupling between light-emitting strings at a position within each string between LEEs 130' and 130". FIG. 2D shows connector 290 electrically coupling all strings; however, this is not a limitation, and in other embodiments only some of the strings may be electrically coupled by a connector 290. FIG. 2D shows one connector 290; however, this is not a limitation of the present invention, and in other embodiments more than one connector 290 may be utilized between other LEEs 130 in some or all strings, for example between LEEs 130 and 130'. FIG. 2E shows an example of a light sheet that includes multiple connectors 291 that electrically couple all strings together between all LEEs 130 in a grid pattern. FIG. 2E shows connectors 291 electrically coupling all strings; however, this is not a limitation, and in other embodiments only some of the strings may be electrically coupled. The numbers of LEEs 130 per string shown in FIGS. 2D and 2E are exemplary, and in other embodiments the number of LEEs 130 per string may be different.

As described in the '200 and '448 patents, the width of the light sheet is typically fixed, but the length may be varied by cutting between adjacent strings 250 of LEEs (for example at cut position 205 in the light sheets of FIGS. 2B and 2C). Serpentine strings generally increase the minimum possible length increment via cuts of the light sheet between strings, relative to the same electrical string having a physically straight (i.e., unfolded) string geometry.

Furthermore, the cutting approach described in the '200 and '448 patents, wherein the length may be adjusted by separating a light sheet into two or more portions between strings, is typically used for cutting to length, as the width of the light sheet is typically fixed. Similarly, the shape of the light sheet is typically fixed. For example, a rectangular or square light sheet typically may not be cut into a circular or triangular shaped light sheet. However, this is not a limitation of the present invention, and in other embodiments light sheets may be separable or cutable in more than one direction, or may not be separable or cutable.

Figure 3:
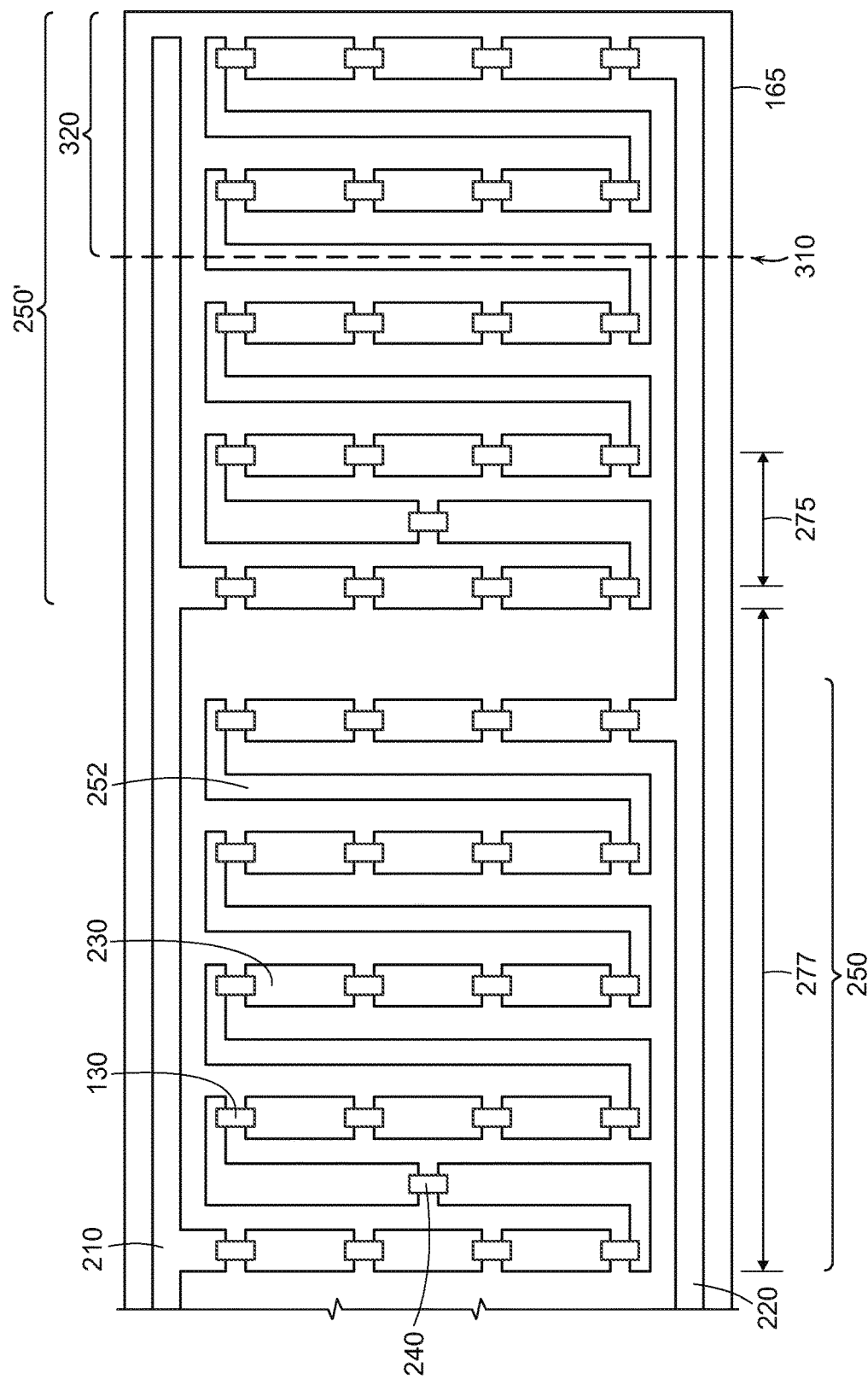
FIG. 3 is a plan-view schematic of a light sheet in accordance with various embodiments of the invention.

FIG. 3 depicts a plan view of the lighting system of FIG. 1A at an early stage of manufacture. The structure shown in FIG. 3 is a plan view of the structure shown in FIG. 1B, and is also similar to the structure shown in FIG. 2C. The lighting system features LEEs 130 grouped into strings 250 on flexible substrate 165. String 250' is identical to string 250; however, at least a portion of substrate 165 under string 250' will be folded under at fold region 310 to form the structure of FIG. 1A. The dashed line indicating fold region 310 also indicates the region for fold 150 in FIG. 1A. The folded lighting system of FIG. 1A is formed by folding substrate 165 at fold region 310, such that the last two sub-string sections 320 in FIG. 3 are folded under, as shown in cross-section in FIG. 1A. A key aspect of embodiments of the present invention is that folding of the lighting system permits adjustment of the length of lighting system by an increment of horizontal LEE pitch 275 instead of string pitch 277, as is typically done when the length is adjusted by cutting of the sheet. In this embodiment of the present invention, the length increment for the lighting system is reduced by about a factor of five by incorporating a folded portion instead of utilizing only length adjustment by cutting or separation between strings.

FIG. 3 shows optional CE 240 in series with LEEs 130; however, this is not a limitation of the present invention, and in other embodiments the lighting system may not have any CEs 240 or may include one or more components having different electrical topology and or functionality.

Figure 4A:
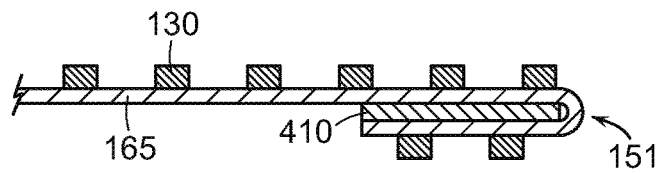
FIGS. 4A-4E, 5A, and 5B are cross-sectional schematics of light sheets in accordance with various embodiments of the invention.
Figure 4B:
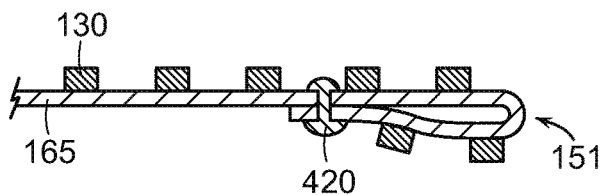

In some embodiments of the present invention, the folded section may be kept in place using an adhesive, tape, clip, rivet, staple, mechanical fastener or the like. FIG. 4A shows an example of an embodiment of the present invention in which an adhesive (e.g., double-sided tape) 410 holds the folded region in place. FIG. 4B shows an example of an embodiment of the present invention in which a rivet 420 holds the folded region in place. In some embodiments, the clip, rivet, staple, or other mechanical fastener may pierce one or all of the light sheet sections in the folded region; however, this is not a limitation of the present invention, and in other embodiments the clip or mechanical fastener may hold the folded portions together without piercing them.

In preferred embodiments of the present invention, folding does not create unwanted shorts or opens in the conductive traces interconnecting LEEs 130 or optional CE 240, nor does it cause separation of LEEs and/or optional CE 240 from the conductive traces. In particular, the end string section (sub-string section 320 in FIG. 3) typically remains operational, such that current may flow through the entire string, even the folded-under portions. A consequence of this is that the LEEs on the folded-under portion of the sheet are also energized and emit light. In some embodiments of the present invention, the light emitted by LEEs 130 from second portion 191 (FIG. 1A) is acceptable; however, in other applications or embodiments such light is undesirable and may be eliminated or partially eliminated by covering the LEEs 130 on second portion 191 of the light sheet.

Figure 4C:
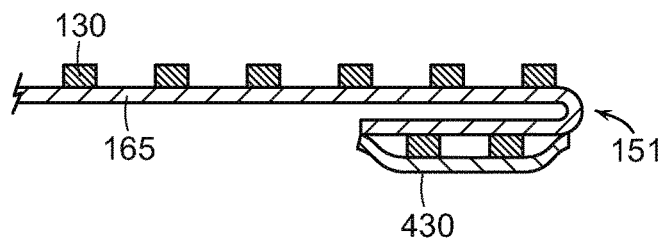
Figure 4D:
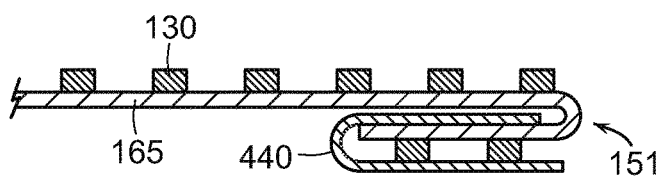

In some embodiments of the present invention, LEEs 130 on second portion 191 may be covered by an opaque or substantially opaque layer 430, for example a tape, glue, potting compound, silicone, epoxy, polymer, or the like, for example as shown in FIG. 4C. In some embodiments of the present invention, all or some of LEEs 130 on second portion 191 of the sheet may be covered by an opaque or substantially opaque sleeve 440, as shown in FIG. 4D. In some embodiments of the present invention, the sleeve 440 may be open (i.e., unsealed), as shown in FIG. 4D, while in others the sleeve 440 or a portion of the sleeve may be sealed against the light sheet to further reduce light emission from second portion 191. Other means may be used to eliminate or reduce undesired light from second portion 191 of the light sheet, for example by coating or painting all or a portion of second portion 191 of the sheet. The means for eliminating or reducing unwanted light from the second portion 191 of the light sheet is not a limitation of the present invention.

Figure 4E:
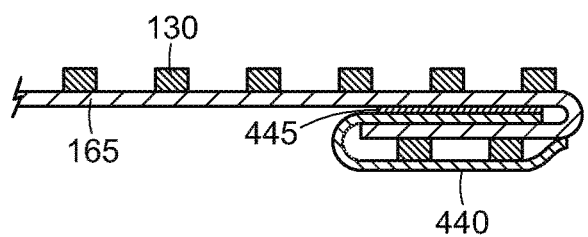

In some embodiments of the present invention, the functions of holding the folded region in place and reducing or eliminating unwanted light from second portion 191 may be combined. For example, FIG. 4E shows an example of an embodiment of the present invention incorporating sleeve 440 with an adhesive (e.g., glue or double-sided tape) 445 holding the back of the sleeve 440 to the light sheet. In this embodiment, the end of sleeve 440 is sealed to substrate 165 to further reduce light leakage from LEEs 130 within sleeve 440. While FIG. 4E shows an example using adhesive and a sleeve to hold the folded portion of the light sheet in place and reduce unwanted light from LEEs on second portion 191 of the light sheet, this is not a limitation of the present invention, and in other embodiments other combinations may be used to hold the folded portion of the light sheet in place and reduce unwanted light from LEEs on second portion 191 of the light sheet, for example combinations of mechanical fasteners and a sleeve, adhesive on the front and back of second portion 191 of the light sheet, a clip that both holds the folded region in place and covers the LEEs on the under-folded portion of the light sheet, or the like.

Figure 5A:
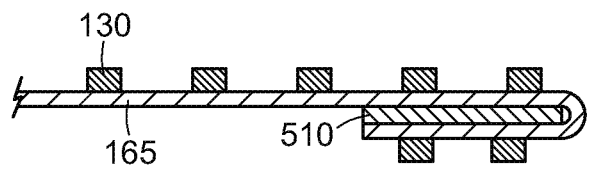

In some embodiments of the present invention, the heat generated by the LEEs in folded region 171 is larger than the heat generated in a similar length of non-folded light sheet, or in a non-folded portion 170 of the sheet, for example because of the larger density of LEEs 130 in a given length of sheet in the folded region 171. In some embodiments of the present invention, the additional heat may be acceptable or permissible to the operation of the system, while in other embodiments it may be desirable to mitigate the heat rise in the folded region. In some embodiments of the present invention, a material having a relatively high thermal conductivity, for example in some embodiments a thermal conductivity higher than that of substrate 165, may be disposed between folded portions of substrate 165 to aid in heat dissipation from LEEs and/or CEs on back-to-back portions of the substrate 165. FIG. 5A shows one example of an embodiment of the present invention that includes a heat sink or heat spreader 510 formed between folded portions of substrate 165. In some embodiments of the present invention, heat sink 510 may include or consist essentially of a sheet of a material having a thermal conductivity greater than that of substrate 165. In some embodiments of the present invention, heat sink 510 may include or consist essentially of a layer or sheet of metal, for example aluminum, copper, steel, plastic, brass, or the like. In some embodiments, heat sink 510 may include or consist essentially of an adhesive, epoxy, glue, tape or the like, that has a relatively high thermal conductivity, for example higher than that of substrate 165. In some embodiments of the present invention, heat sink 510 may have a thermal conductivity of at least 0.1 W/mK, or at least 1 W/mK, or at least 100 W/mK, or at least 200 W/mK. In some embodiments of the present invention, heat sink or heat spreader 510 may include or consist essentially of a heat pipe. In some embodiments, heat sink 510 may have a thickness in the range of about 5 μm to about 2 mm. While FIG. 5A shows heat sink or heat spreader 510 as having a size substantially the same as the under-folded portion of the light sheet, this is not a limitation of the present invention, and in other embodiments heat sink or heat spreader 510 may be larger or smaller than the under-folded portion of the light sheet.

Figure 5B:
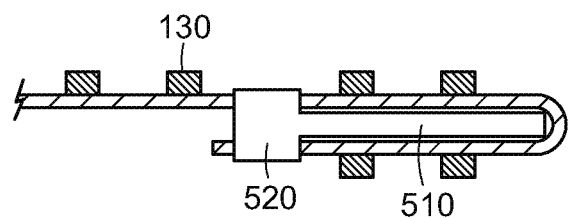

In some embodiments of the present invention, heat sink 510 may include or consist essentially of a layer or sheet of plastic or tape or glue. In some embodiments, heat sink 510 may include or consist essentially of a tape or double-sided tape having a relatively high thermal conductivity, for example a thermally conductive adhesive transfer tape such as the 8800, 8900 or 9800 series tapes from 3M or the TR series of thermally conductive tape from Nitto Denko. In some embodiments of the present invention, a thermally conductive tape, adhesive or glue may be used to reduce heat buildup in the folded over region and hold the folded portion in place. In some embodiments of the present invention, heat dissipation may be improved and the folded portion held in place using a mechanical clip including or consisting of a heat sink 510 and a means for holding the folded portion in place, for example a clip, rivet, staple or the like. FIG. 5B shows an example of one embodiment of the present invention that includes heat sink 510 and clip 520 that holds the light sheet around heat sink 510. In some embodiments the clip, rivet, staple or other mechanical fastener may pierce one or all of the light sheets in the folded region; however, this is not a limitation of the present invention, and in other embodiments the clip or mechanical fastener may hold the folded portions together without piercing them.

In some embodiments of the present invention, a sleeve covering all or a portion of the folded-under region, similar to that discussed in reference to FIG. 4D, may act as a heat sink or heat spreader. In some embodiments a sleeve may include or consist essentially of a material having a thermal conductivity greater than that of substrate 165; however, this is not a limitation of the present invention, and in other embodiments the sleeve may have a thermal conductivity less than that of substrate 165.

In some embodiments a sleeve or clip or tape or adhesive may provide combined functionality, for example acting as a heat sink or heat spreader and/or reducing unwanted light from the LEEs on second portion 191 of the light sheet and/or holding the under-folded portion of the light sheet in place.

Figure 6:
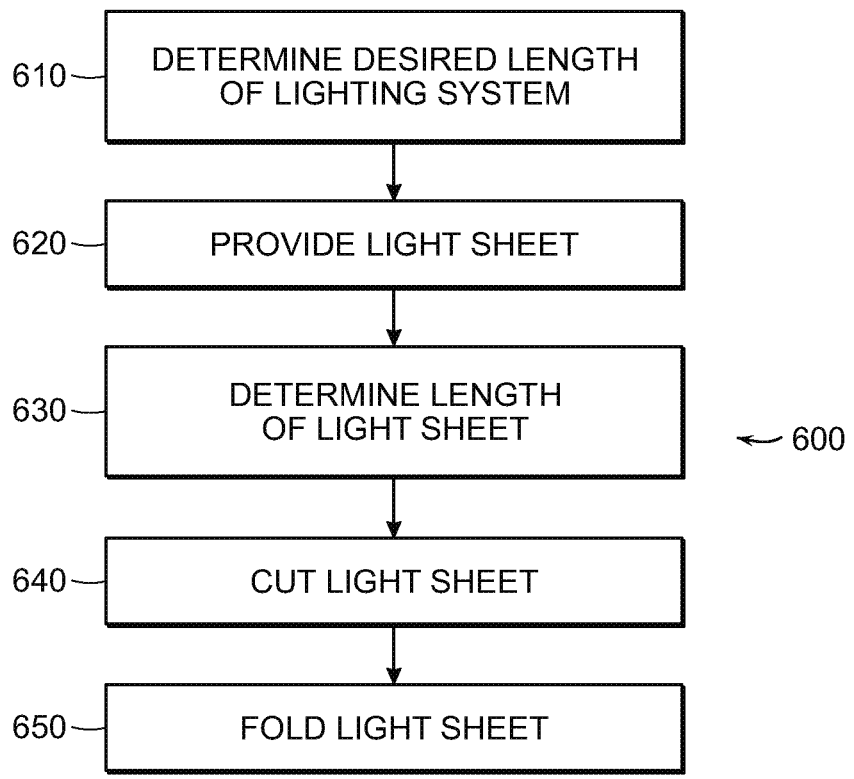
FIG. 6 is a process flow in accordance with various embodiments of the invention.

FIG. 6 shows a flow chart of a process 600 for forming a lighting system in accordance with embodiments of the present invention. Process 600 is shown having five steps; however, this is not a limitation of the present invention and in other embodiments the invention has more or fewer steps and/or the steps may be performed in different order. In step 610, a desired length for the lighting system is determined. In step 620, a light sheet is provided. In step 630, the length of the light sheet is determined. In step 640 the light sheet is cut to length. In various embodiments, cutting to length includes cutting to a length larger than the desired length for the lighting system, as determined in step 610. In various embodiments, the difference between the desired length of the lighting system and the length of the light sheet is less than the string pitch 277. In step 650, the portion of the light sheet that is longer than the desired length of the lighting system is folded under (or "underfolded"), resulting in a lighting system of the desired length. Various approaches to process 600 are discussed herein. In some embodiments of the present invention, process 600 is designed to maximize the illuminated length of light sheet within the lighting system by cutting the light sheet between strings to a length longer than that of desired length, underfolding, within a string, an end portion of the light sheet, resulting in a shorter light sheet (first portion 190) having a length substantially equal to the desired length and a minimum underfolded length (second portion 191). However, this is not a limitation of the present invention, and in other embodiments other approaches to process 600 may be utilized, for example the length of second portion 191 may not be minimized, or the light sheet may be folded with one or more different configurations than the 180° underfold described in reference to FIG. 1A.

In step 610, a desired length for the lighting system is determined. In some embodiments of the present invention, the desired length may be the illuminated length or it may be the physical length. Once the desired length is determined, the light sheet may be provided, per step 620. The length of the light sheet is determined in step 630. In some embodiments of the present invention, the light sheet is longer than the desired length by at least a portion of a string pitch 277. In some embodiments of the present invention, the light sheet length (in multiples of string pitch 277) is given by (desired length/string pitch 277) rounded up to the next highest integer, that is the length is an integer number of string pitches 277 that is less than one string pitch 277 length longer than the desired length.

In some embodiments of the present invention, the additional partial string length that will become second portion 191 may result in additional power consumption and/or additional unwanted light and/or a reduction in the effective luminous efficacy of the lighting system and/or additional cost for the lighting system. In some embodiments of the present invention, the light from LEEs 130 on second portion 191 is not utilized in the lighting system and may result in a relatively small reduction in effective efficiency, for example luminous efficacy. In some embodiments of the present invention, the reduction in luminous efficacy may be calculated as follows:

Effective luminous efficacy=luminous efficacy of unfolded sheet×(luminous intensity from first portion 190/(luminous intensity from first portion 190+luminous intensity from second portion 191).

or

Effective luminous efficacy=luminous efficacy of unfolded sheet×(number of LEEs 130 on first portion 190/(number of LEEs 130 on first portion 190+number of LEEs on second portion 191).

with the assumption that all LEEs 130 are operating at substantially the same luminous efficacy.

In some embodiments of the present invention, the effective luminous efficacy approaches the luminous efficacy of the unfolded sheet as the ratio of the light from first portion 190 to light from second portion 191 increases. For example, in one embodiment of the present invention, a lighting system utilizes a light sheet having horizontal LEE pitch 275 of about 10 mm, string pitch 277 of about 50 mm and a desired length of about 520 mm. In this example, first portion 191 is about 520 mm and second portion 191 is about 30 mm. The light emitted from second portion 191 is given approximately by lumens/string×(length of second portion 191/string pitch 277) or by lumens/string×(number of LEEs 130 on second portion 191/number of LEEs on second portion 191). In this example, each string emits about 100 lumens and the luminous efficacy of the unfolded light sheet is about 140 lumens per watt (lpw). In this case, the light emitted from second portion 191 is given approximately by 100×30/50 or about 60 lumens. The light emitted from first portion 190 is given approximately by 100×520/50 or about 1040 lumens (first portion 190 includes 520/50 strings). Thus, the effective luminous efficacy is given approximately by 100×1040/(1040+60) or 100×1040/1100 or about 94.5 lpw. For a similar lighting system having a desired length of about 2020 cm, the effective luminous efficacy increases to about 98.5 lpw. In some embodiments of the present invention, the efficiency loss associated with second portion 191 is less than 10% or less than 5% or less than 2%. In some embodiments of the present invention, the luminous efficacy in folded light sheet 101 is at least 90%, or at least 95% or at least 98% of that of the unfolded light sheet, or of the luminous efficacy of first portion 190.

Figure 7A:
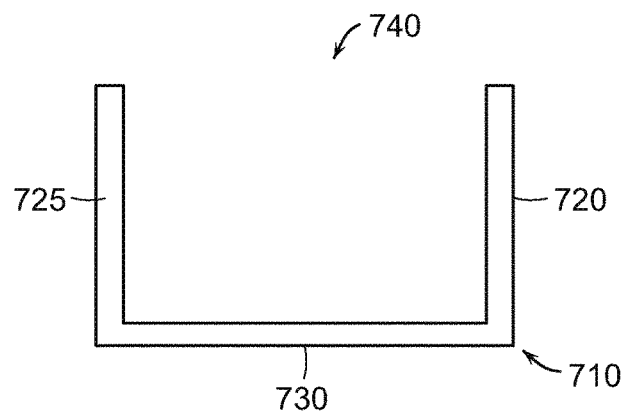
FIGS. 7A-7C are schematic side views of partial illumination systems in accordance with various embodiments of the invention.

In some embodiments of the present invention, light sheet 101 may be mounted in a fixture or housing to create a lighting system in accordance with embodiments of the present invention, permitting relatively fine control of the illuminated length of the fixture. For example, FIG. 7A shows a cross-sectional view of a portion of a housing 710 in accordance with embodiments of the present invention having sidewalls 720 and 725, a base 730 connecting the two sidewalls, and an opening 740 opposite the base from which light is emitted from the fixture. In some embodiments, fixture 710 may be manufactured by extrusion; however, this is not a limitation of the present invention, and in other embodiments fixture 710 may be formed by other means, for example machining, bending, folding, molding, or the like. In some embodiments, fixture 710 may be one piece, while in other embodiments fixture 710 may include or consist essentially of more than one component that fit together. For example, sidewalls 720 and 725 and base 730 may all be separate components that are assembled to form fixture 710. In some embodiments, all or a portion of opening 740 is covered by a diffuser or optic (e.g., one or more lenses). In some embodiments, the diffuser may include or consist essentially of a transparent or translucent or perforated material. In some embodiments of the present invention, the diffuser may include or consist essentially of plastic, metal, glass, fabric, paper, or the like. While FIG. 7B shows the LEEs 130 in the width direction of the structure, this is not a limitation of the present invention, and in other embodiments greater or fewer LEEs 130 may be utilized.

Figure 7B:
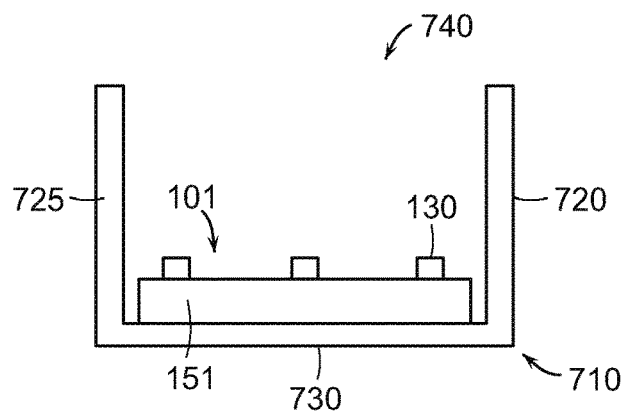
Figure 7C:
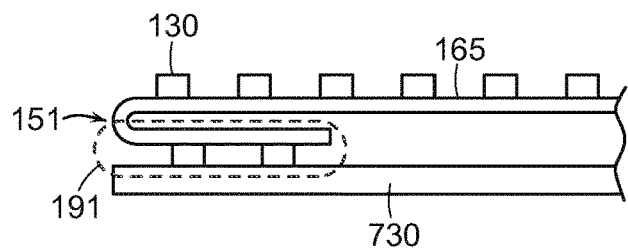

FIGS. 7B and 7C show end and side views of a portion of a lighting system, in accordance with embodiments of the present invention, which features a folded light sheet 101 within the fixture or housing 710. The edge of fold 151 is visible in FIG. 7B. Sidewalls 720 and 725 are not shown in FIG. 7C for clarity. As shown in FIG. 7C, light sheet 101 includes a second portion 191 that enables light sheet 101 to fit within the desired fixture length to within one horizontal LEE pitch 275.

Figure 8A:
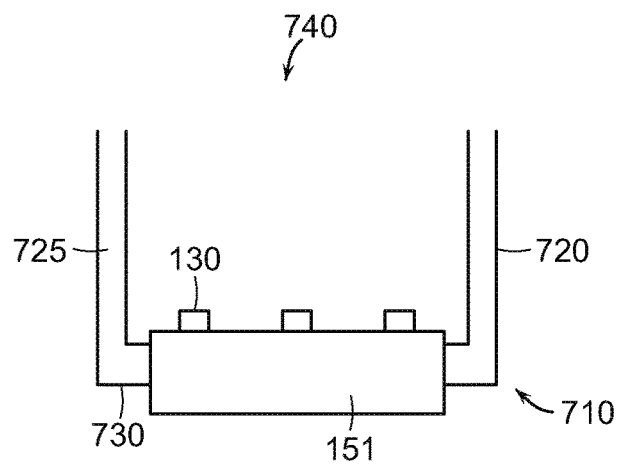
FIGS. 8A-8E are schematics of partial illumination systems in accordance with various embodiments of the invention.
Figure 8B:
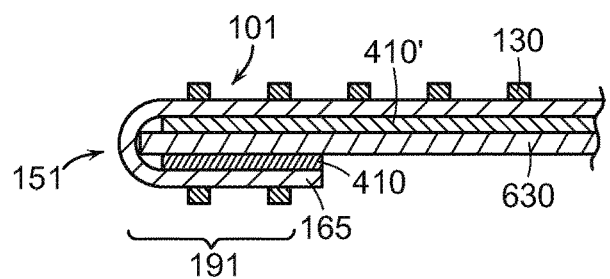
Figure 8C:
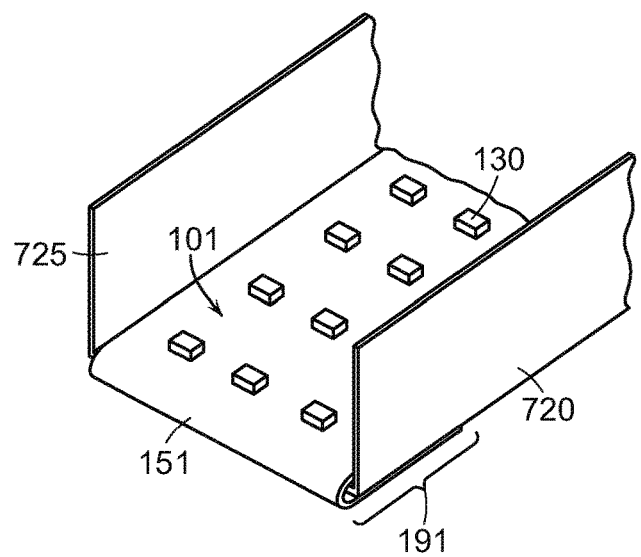

In some embodiments of the present invention, heat may be removed or mitigated in the under-folded region by utilizing all or a portion of the fixture or housing into which the light sheet is mounted. FIGS. 8A-8C show an end view, a cross-sectional view, and an isometric view of an example of an embodiment of the present invention featuring folded light sheet 101 and in which a portion of the light sheet is folded around a portion of base 730. Sidewalls 720 and 725 are not shown in FIG. 8B for clarity. In some embodiments of the present invention, a light sheet 101 is mounted on the base portion 730 of fixture 710 and all or a portion of second part 191 of light sheet 101 is folded under a portion of base 730, as shown in FIGS. 8A-8C, such that at least a portion of fixture 710 acts as a heat sink for light sheet 101. In some embodiments, the under-folded portion of the light sheet may be held in place using adhesive (e.g., tape) 410, as shown in FIG. 8B. FIG. 8B shows optional attachment of additional portions of the light sheet to the fixture, for example portions of the light sheet on the top of the base of the extrusion using adhesive (e.g., tape) 410'. In some embodiments of the present invention, adhesive 410 is the same as adhesive 410', while in other embodiments they are different attachment agents. In some embodiments, portions of the light sheet, either under-folded or not, or both, may be held in place using one or more clips, rivets, staples or other mechanical fasteners. FIG. 8D shows an example of the under-folded portion of the light sheet held in place using a rivet 420. While one rivet 420 is shown in FIG. 8D, this is not a limitation of the present invention, and in other embodiments more than one rivet may be utilized. While rivet 420 in FIG. 8D penetrates through both portions of the light sheet, this is not a limitation of the present invention, and in other embodiments rivet 420 may only go through one portion of the light sheet.

In the example shown in FIGS. 8A-8C, the light from LEEs 130 on second portion 191 of the light sheet may be reduced sufficiently by folding these LEEs onto the outside of the enclosure; however, this is not a limitation of the present invention, and in other embodiments, tape, clips, sleeves or the like, as described herein, may be utilized to reduce unwanted light from the LEEs on the under-folded portion of the light sheet.

Systems and methods described herein with respect to free-standing light sheets to keep the folded portion of the light sheet in place, to reduce unwanted light from LEEs on the under-folded portion of the light sheet and to reduce or mitigate heat in the under-folded portion may be applied to one or more light sheets mounted in a fixture, extrusion or housing. For example, in some embodiments, the light sheet may be attached to the fixture using tape or adhesive, rivets, clips, staples or other mechanical fasteners to hold the light sheet in place and/or to help reduce or mitigate heat generated by the LEEs or to reduce or eliminate unwanted light from LEEs on the under-folded portion of the light sheet. In some embodiments, such means may also be applied to the non-folded portions of the light sheet, for example to reduce heat generated by the LEEs and/or to hold the light sheet in place in the housing or fixture. In some embodiments of the present invention, attaching the light sheet to a portion of the fixture or housing may permit reduction of the junction temperature of the LEEs or may permit the LEEs to be driven at a higher current that would be possible on a free-standing light sheet.

Figure 8E:
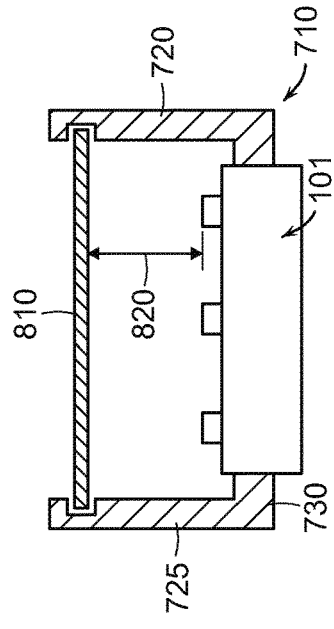
Figure 8D:
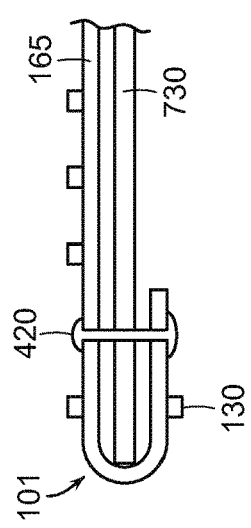

FIG. 8E shows a cross-sectional view of a lighting system in accordance with embodiments of the present invention. As shown, the lighting system includes housing 710, folded light sheet 101, and diffuser or optic 810 covering opening 740. In some embodiments, optic 810 may include or consist essentially of a refractive optic, a reflective optic, and/or a Fresnel optic. In some embodiments, diffuser or optic 810 may be spaced apart from the light sheet by a diffuser gap 820, as shown in FIG. 8E. In some embodiments, diffuser gap 820 may be in the range of about one-half of the LEE pitch to about three times the LEE pitch, or in the range of about one LEE pitch to about 1.5 times the LEE pitch. In one embodiment of the present invention, light sheet 101 has a LEE pitch of about 7 mm and diffuser gap 820 may be in the range of about 10 mm to about 15 mm. In one embodiment of the preset invention, light sheet 101 has a LEE pitch of about 15 mm and diffuser gap 820 may be in the range of about 20 mm to about 30 mm.

Figure 9B:
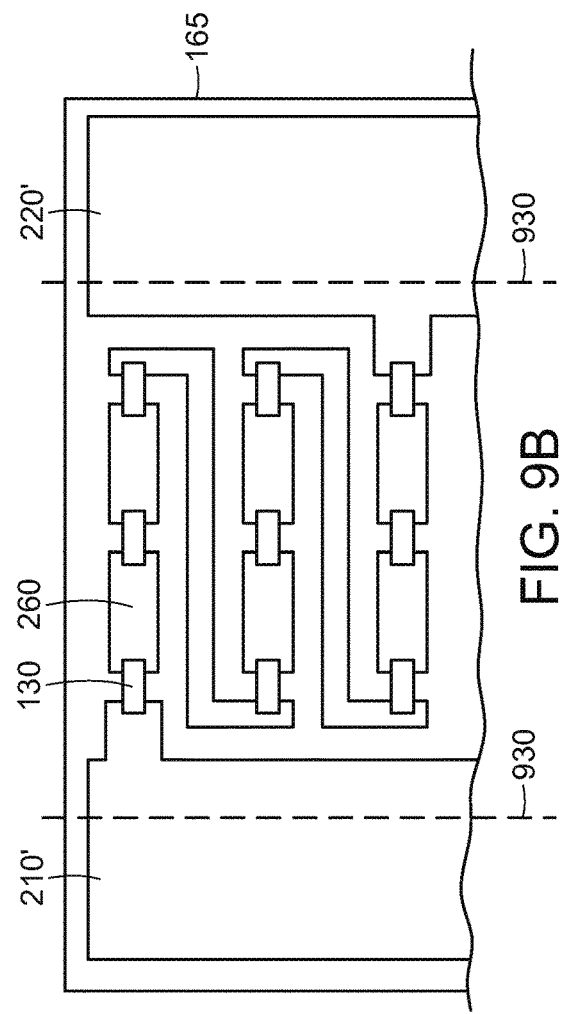
FIG. 9B is a plan-view schematic of an illumination system in accordance with various embodiments of the invention.
Figure 9A:
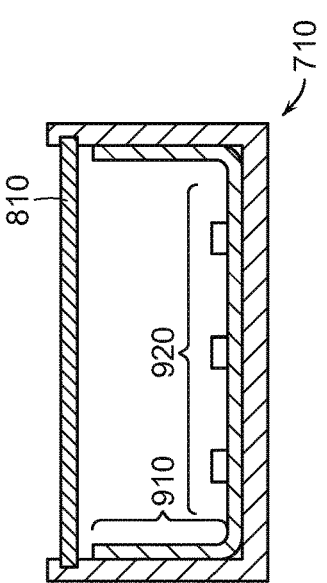
FIG. 9A is a cross-sectional schematic of an illumination system in accordance with various embodiments of the invention.

In some embodiments, light sheet 100 or 101 may include portions of substrate 165 that are within and/or outside of the illuminated region and that may have one or more advantageous electrical, optical, mechanical, or thermal properties. For example, FIG. 9A shows one embodiment of the present invention, similar to that shown in FIG. 8E; however, in this embodiment at least a portion 910 of the width of light sheet 101 extends beyond the region containing LEEs 130, and this is conformed or folded to conform to the interior geometry of fixture 710. In some embodiments of the present invention, all or a portion of substrate 165 is reflective to a wavelength of light emitted by LEEs 130 and portions of substrate 165 may be used to cover portions of housing 710 to provide a more reflective surface than that of housing 710, resulting in an increase in the light emitted from housing 710 (i.e., an increase in the fixture efficiency). In one embodiment, housing 710 may include or consist essentially of a metal, for example aluminum or steel, or a plastic and have a reflectance in the range of about 20% to about 60%. In some embodiments, substrate 165 may have a reflectance of at least 60%, or at least 75% or at least 90%. For example, in some embodiments, substrate 165 may have a diffuse or specular reflectance to a wavelength of light emitted by LEEs 130 of at least 60%, at least 75%, or at least 90%. In some embodiments, substrate 165 may be a diffuse reflector, for example substrate 165 may be white or may be coated with a white reflectance layer, while in other embodiments substrate 165 may be a specular reflector or may be coated with a specular reflectance coating, for example a layer of aluminum, copper, gold, silver, chromium, or the like. In some embodiments, all or substantially all or a portion of substrate 165, conductive elements 260, and power conductors 210, 220 may be covered with a reflecting layer, for example a white ink, silicone, solder mask, or the like. In some embodiments, substrate 165 in a region 920 containing LEEs 130 may have the same optical, mechanical and/or thermal properties as substrate 165 in subsidiary region 910; however, this is not a limitation of the present invention, and in other embodiments regions 910 and 920 may have different optical properties and/or different mechanical properties and/or different thermal properties.

In one embodiment of the present invention, power conductors 210, 220 may be extended into region 910, for example to increase the conductivity of the power conductors, for example to permit a longer lighting system and/or to reduce resistance losses in power conductors 210, 220. FIG. 9B shows an example of an embodiment of the present invention that includes extended power conductors 210', 220'. The dashed lines show the approximate interfaces 930 between regions 910 and 920 (where, e.g., the light sheet may be folded).

In some embodiments of the present invention, a lighting system may include or consist essentially of one or more light sheets 100, 101 and a power supply or driver. In some embodiments, the driver or power supply may provide a constant voltage, while in other embodiments the driver or power supply may provide a constant current. In some embodiments, light sheets 100, 101 may be powered by an AC signal or a signal with an arbitrary periodicity and/or waveform. The method of powering light sheets 100, 101 is not a limitation of the present invention.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of light-emitting elements include solid-state, organic, polymer, phosphor-coated or high-flux LEDs, laser diodes or other similar devices as would be readily understood. The emitted radiation of an LEE may be visible, such as red, blue or green, or invisible, such as infrared or ultraviolet. An LEE may produce radiation of a continuous or discontinuous spread of wavelengths. An LEE may feature a phosphorescent or fluorescent material, also known as a light-conversion material, for converting a portion of its emissions from one set of wavelengths to another. In some embodiments, the light from an LEE includes or consists essentially of a combination of light directly emitted by the LEE and light emitted by an adjacent or surrounding light-conversion material. An LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective. Herein "reflective" is defined as having a reflectivity greater than 65% for a wavelength of light emitted by the LEE on which the contacts are disposed unless otherwise defined. In some embodiments, an LEE may include or consist essentially of an electronic device or circuit or a passive device or circuit. In some embodiments, an LEE includes or consists essentially of multiple devices, for example an LED and a Zener diode for static-electricity protection. In some embodiments, an LEE may include or consist essentially of a packaged LED, i.e., a bare LED die encased or partially encased in a package. In some embodiments, the packaged LED may also include a light-conversion material. In some embodiments, the light from the LEE may include or consist essentially of light emitted only by the light-conversion material, while in other embodiments the light from the LEE may include or consist essentially of a combination of light emitted from an LED and from the light-conversion material. In some embodiments, the light from the LEE may include or consist essentially of light emitted only by an LED.

One or more non-LEE devices such as Zener diodes, transient voltage suppressors (TVSs), varistors, etc., may be placed on each light sheet to protect the LEEs 130 from damage that may be caused by high-voltage events, such as electrostatic discharge (ESD) or lightning strikes. In one embodiment, one or more protection devices may be electrically coupled between power conductor 210 and power conductor 220, for example between the positive and negative power conductors, using conductive elements such as conductive elements 260. Such conductive elements may also serve to provide a uniform visual pattern of lines in the web direction, which may be more aesthetically pleasing than a light sheet with noticeable gaps between LEE strings 250. In a more general sense, in addition to conductive traces 260 that are part of string 250, additional conductive traces 260 that may or may not be electrically coupled to other strings 250 and/or power conductors 210, 220 may be formed on substrate 165, for example to provide additional power conduction pathways or to achieve a decorative or aesthetically pleasing look to the pattern on the light sheet or to provide a communication pathway to one or more CEs 240, for example to provide a control signal to the one or more CEs 240. These trace segments also serve to provide a uniform visual pattern of lines in the web direction, which may be more aesthetically pleasing than a light sheet with noticeable gaps between LEE strings 250.

In one embodiment, an LEE 130 includes or consists essentially of a bare semiconductor die, while in other embodiments an LEE 130 includes or consists essentially of a packaged LED. In some embodiments, LEE 130 may include or consist essentially of a "white die" that includes an LED that is integrated with a light-conversion material (e.g., a phosphor) before being attached to the light sheet, as described in U.S. patent application Ser. No. 13/748,864, filed Jan. 24, 2013, or U.S. patent application Ser. No. 13/949,543, filed Jul. 24, 2013, the entire disclosure of each of which is incorporated by reference herein.

In some embodiments, LEEs 130 may emit light in a relatively small wavelength range, for example having a full width at half maximum in the range of about 20 nm to about 200 nm. In some embodiments, all LEEs 130 may emit light of the same or substantially the same wavelength, while in other embodiments different LEEs 130 may emit light of different wavelengths. In some embodiments LEEs 130 may emit white light, for example that is perceived as white light by the eye. In some embodiments, the white light may be visible light with a spectral power distribution the chromaticity of which is close to the blackbody locus in the CIE 1931 xy or similar color space. In some embodiments, white light has a color temperature in the range of about 2000 K to about 10,000 K. The emission wavelength, full width at half maximum (FWHM) of the emitted light or radiation or other optical characteristics of LEEs 130 may not be all the same and are not a limitation of the present invention.

Substrate 165 may include or consist essentially of a semicrystalline or amorphous material, e.g., polyethylene naphthalate (PEN), polyethylene terephthalate (PET), polycarbonate, polyethersulfone, polyester, polyimide, polyethylene, fiberglass, FR4, metal core printed circuit board, (MCPCB), and/or paper. In some embodiments of the present invention substrate 165 may include multiple layers. Depending upon the desired application for which embodiments of the invention are utilized, substrate 165 may be substantially optically transparent, translucent, or opaque. For example, substrate 165 may exhibit a transmittance or a reflectivity greater than 70% for optical wavelengths ranging between approximately 400 nm and approximately 700 nm. In some embodiments substrate 165 may exhibit a transmittance or a reflectivity of greater than 70% for one or more wavelengths emitted by LEEs 130. Substrate 165 may also be substantially insulating, and may have an electrical resistivity greater than approximately 100 ohm-cm, greater than approximately $1 \times 10^6$ ohm-cm, or even greater than approximately $1 \times 10^{10}$ ohm-cm. In some embodiments substrate 165 may have a thickness in the range of about 10 µm to about 500 µm.

Conductive elements, e.g., power conductors 210, 220 and conductive traces 260, may be formed via conventional deposition, photolithography, and etching processes, plating processes, lamination, lamination and patterning, evaporation sputtering or the like or may be formed using a variety of different printing processes. For example, power conductors 210, 220 and conductive traces 260 may be formed via screen printing, flexographic printing, ink jet printing, and/or gravure printing. Power conductors 210, 220 and conductive traces 260 may include or consist essentially of a conductive material (e.g., an ink or a metal, metal film or other conductive materials or the like), which may include one or more elements such as silver, gold, aluminum, chromium, copper, and/or carbon. Power conductors 210, 220 and conductive traces 260 may have a thickness in the range of about 50 nm to about 1000 µm. In some embodiments, the thickness of power conductors 210, 220 and conductive traces 260 may be determined by the current to be carried thereby. While the thickness of one or more of power conductors 210, 220 and conductive traces 260 may vary, the thickness is generally substantially uniform along the length of the trace to simplify processing. However, this is not a limitation of the present invention, and in other embodiments the thickness and/or material of power conductors 210, 220 and conductive traces 260 may vary. In some embodiments, all or a portion of power conductors 210, 220 and conductive traces 260 may be covered or encapsulated. In some embodiments, a layer of material, for example insulating material, may be formed over all or a portion of power conductors 210, 220 and conductive traces 260. Such a material may include, e.g., a sheet of material such as used for substrate 165, a printed layer, for example using screen, ink jet, stencil or other printing means, a laminated layer, or the like. Such a printed layer may include, for example, an ink, a plastic and oxide, or the like. The covering material and/or the method by which it is applied are not limitations of the present invention.

In one embodiment, the conductive traces 260 are formed with a gap between adjacent conductive traces 260, and LEEs 130 and CEs 240 are electrically coupled to conductive traces 260 using conductive adhesive, e.g., an isotropically conductive adhesive and/or an ACA. ACAs may be utilized with or without stud bumps and embodiments of the present invention are not limited by the particular mode of operation of the ACA. For example, the ACA may utilize a magnetic field rather than pressure (e.g., the ZTACH ACA available from SunRay Scientific of Mt. Laurel, N.J., for which a magnetic field is applied during curing in order to align magnetic conductive particles to form electrically conductive "columns" in the desired conduction direction). Furthermore, various embodiments utilize one or more other electrically conductive adhesives, e.g., isotropically conductive adhesives, non-conductive adhesives, in addition to or instead of one or more ACAs. In other embodiments, LEEs 130 and CEs 240 may be attached to and/or electrically coupled to conductive traces 260 by other means, for example solder, reflow solder, wave solder, wire bonding, or the like. The method by which LEEs 130 and CEs 240 are attached to conductive traces 260 is not a limitation of the present invention.

CE 240 may be one component or multiple active and/or passive components. In one embodiment, power conductors 210, 220 provide a DC voltage or substantially DC voltage and CE 240 includes or consists essentially of a resistor, e.g. a current-limiting resistor. The choice of the resistance value may be a trade-off between a number of parameters and characteristics that may include, e.g., efficiency and current stability. In general, a larger resistance will result in reduced efficiency but greater current stability, while a smaller resistance will result in increased efficiency but reduced current stability. Variations in the current may result from variations in the input voltage (for example across power conductors 210, 220), variations in forward voltage of the LEEs 130 within the string, variations in the value of the current-limiting resistor, variations in current that may occur if one or more LEEs 130 in the string become short-circuited or the like. In the case of CE 240 including or consisting essentially of a resistor, in some embodiments CE 240 is a discrete resistor formed within or on conductive traces 260, such as a chip resistor, a bare-die resistor or surface mount device (SMD) resistor.

As discussed above, in embodiments where CE 240 includes or consists essentially of a resistor, there may be trade-offs between efficiency and current stability. While such trade-offs may be acceptable in certain products, other products may require relatively better current stability at higher efficiencies, and in these cases CE 240 may include or consist essentially of multiple components or a circuit element, as discussed above. In some embodiments CE 240 includes or consists essentially of a field-effect transistor (FET) and a resistor. In another embodiment CE 240 includes or consists essentially of two bipolar junction transistors (BJTs) and two resistors.

In general, the efficiency and current stability increase with the number of components, as does the cost. In some embodiments where CE 240 includes or consists essentially of multiple components, the components may be in discrete form (i.e., each component individually electrically coupled to conductive traces 260) or in hybrid form (where multiple separate components are mounted on a submount, which is then electrically coupled to conductive traces 260), or in monolithic form (where multiple components are integrated on a semiconductor chip, for example a silicon-based or other semiconductor-based integrated circuit). In some embodiments, CE 240 may be in bare-die form, while in other embodiments CE 240 may be packaged or potted or the like. In some embodiments, CE 240 may include or consist essentially of a bare-die integrated circuit. In some embodiments, the integrated circuit includes or consists essentially of multiple active and/or passive devices that are fabricated on a common semiconductor substrate.

In an exemplary embodiment, CE 240 is configured to maintain a constant or substantially constant current through LEEs 130 of string 250. For example, in some embodiments, a constant voltage may be applied to power conductors 210, 220, which may, under certain circumstances may have some variation, or the sum of the forward voltages of LEEs 130 in different strings may be somewhat different, for example as a result of manufacturing tolerances, or the component and/or operational values of the element(s) within CE 240 may vary, for example as a result of manufacturing tolerances or changes in operating temperature, and CE 240 acts to maintain the current through LEEs 130 substantially constant in the face of these variations. In other words, in some embodiments the input to the light sheet is a constant voltage that is applied to power conductors 210, 220, and CEs 240 convert the constant voltage to a constant or substantially constant current through LEEs 130. As will be described herein, the design of CE 240 may be varied to provide different levels of control or variation of the current through LEEs 130. In some embodiments, CEs 240 may control the current through LEEs 130 to be substantially constant with a variation of less than about ±25%. In some embodiments, CEs 240 may control the current through LEEs 130 to be substantially constant with a variation of less than about ±15%. In some embodiments, CEs 240 may control the current through LEEs 130 to be substantially constant with a variation of less than about ±10%. In some embodiments, CEs 240 may control the current through LEEs 130 to be substantially constant with a variation of less than about ±5%.

In some embodiments, as detailed herein, CEs 240 may, in response to a control signal, act to maintain a constant or substantially constant current through LEEs 130 until instructed to change to a different constant or substantially constant current, for example by an external control signal. In some embodiments, as detailed herein, all CEs 240 on a sheet may act in concert, that is maintain or change the current through all associated LEEs 130; however, this is not a limitation of the present invention, and in other embodiments one or more CEs 240 may be individually instructed and/or energized.

In other embodiments, power conductors 210, 220 may provide AC power, or power modulated at different frequencies and in these embodiments CEs 240 may be selected accordingly or may be omitted. In one embodiment, power conductors 210, 220 may provide a standard line voltage, for example about 120 VAC or about 240 VAC or about 277 VAC, for example at about 50 Hz or about 60 Hz. In some embodiments, CEs 240 may accommodate a plurality of input types, and thus be so-called "universal" CEs 240, while in other embodiments different CEs 240 may be required for different input types. The actual component or components of CEs 240 are not limiting to this invention; however, in preferred embodiments of this invention, the positioning of CEs 240 does not disrupt the LEE pitch. In another embodiment of this invention, the positioning of CEs 240 is independent of LEE pitch. As discussed herein, CEs 240 and LEEs 130 may be electrically coupled to conductive traces 260 using a variety of means, for example solder, conductive adhesive or anisotropic conductive adhesive (ACA); however, the method of electrical coupling of CEs 140 and LEEs 130 is not a limitation of the present invention.

As utilized herein, and as understood by those of skill in the art, specular reflectance refers to directional reflectance, in which an incident beam is preferentially reflected from a surface at a defined angle (typically the complementary angle to the angle of incidence). This differs from diffuse reflectance, which is omnidirectional, i.e., similar or identical to Lambertian "emission" of a reflected beam by a surface, as described above. Thus, a specular reflectance of a value less than 100% typically refers to the amount of an incident beam that is preferentially reflected at the defined angle, rather than scattered in other directions.

In some embodiments, specular reflectance may be quantified by measuring the intensity of light reflected from a test sample relative to that reflected from a reference sample (for example, a surface having substantially 100% specular reflectance). In this measurement configuration, the probe light source is a relatively collimated beam incident upon the test sample at a specific angle, and the detector is a relatively narrow aperture detector positioned at the complementary angle (i.e., the same angle as the probe beam but azimuthally rotated by about 180°). For example, if the intensity measured for a test sample is about one-half of that for the reference sample, the specular reflectance is then about 50%, compared to the reference sample. In some embodiments, the aperture may be about 1°, or about 5°, or about 10°, and the measurement angle may be between about 20° and about 60°. ANSI/IESNA RP-16-05 "Nomenclature and Definitions for Illuminating Engineering," the entire disclosure of which is incorporated by reference herein, provides a detailed definition of reflectance in Section 7.3.3.

In some embodiments, specular reflectance may be quantified using a gloss measurement. In some embodiments, the gloss measurement may utilize a configuration similar to that for specular reflectance measurements described above. One method of measuring gloss level is to determine the intensity of a probe beam reflected off the test sample relative to the intensity reflected off of a reference sample at a specific angle of incidence for the probe beam and a relatively narrow aperture detector. A number of different standards for measuring gloss level have been developed for different types of materials and gloss levels. In general, lower angles of incidence are used for higher gloss levels. Examples of gloss measurement standards include ASTM D523, ASTM D2457, and DIN 67530 for relatively high gloss levels, the entire disclosure of each of which is incorporated by reference herein. Typical incidence angles for relatively high gloss samples are 20°, 40°, and 60°. Gloss levels range from 0 to 100, with 0 representing a very low level of gloss (i.e., a diffuse surface), while 100 represents a very high gloss level (i.e., a highly specular reflecting surface). In some embodiments of the present invention, the light sheet has a gloss level of at least 10, or at least 20, for a 20° measurement, for example using the procedure in ASTM D523 or ASTM D2457. In some embodiments of the present invention, the light sheet has a gloss level of at least 30, or at least 50, for a 60° measurement, for example using the procedure in ASTM D523 or ASTM D2457.

In general in the above discussion the arrays of semiconductor dies, light-emitting elements, optics, and the like have been shown as square or rectangular arrays; however this is not a limitation of the present invention and in other embodiments these elements may be formed in other types of arrays, for example hexagonal, triangular or any arbitrary array. In some embodiments these elements may be grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. An illumination device comprising:
a flexible light sheet that is substantially planar in an unfolded configuration, the light sheet comprising (i) a flexible substrate having first and second opposed surfaces and (ii) a plurality of light-emitting elements disposed over the first surface of the substrate,
wherein:
the light sheet is folded along a back-to-back fold dividing a first portion of the light sheet from a second portion of the light sheet,
the first portion of the light sheet comprises a first group of one or more of the light-emitting elements disposed thereon,
the second portion of the light sheet comprises a second group of one or more of the light-emitting elements disposed thereon,
proximate the fold, (a) the first portion of the light sheet is disposed beneath the second portion of the light sheet, (b) the first group of one or more of the light-emitting elements faces and emits light in a first direction, and (c) the second group of one or more of the light-emitting elements faces and emits light in a second direction opposite the first direction, and
light is emitted by both the first and second groups of light-emitting elements.

2. The illumination device of claim 1, wherein the second surface of the first portion of the light sheet is adjacent to the second surface of the second portion of the light sheet.

3. The illumination device of claim 1, wherein at least a portion of the second surface of the first portion of the light sheet is in contact with at least a portion of the second surface of the second portion of the light sheet.

4. The illumination device of claim 1, wherein at least a portion of the second surface of the first portion of the light sheet is adhered directly to at least a portion of the second surface of the second portion of the light sheet with an adhesive.

5. The illumination device of claim 1, wherein at least a portion of the first portion of the light sheet is mechanically fastened to at least a portion of the second portion of the light sheet.

6. The illumination device of claim 1, further comprising a material disposed only (i) over at least a portion of the first portion of the light sheet and/or (ii) between the first and second portions of the light sheet.

7. The illumination device of claim 6, wherein the material has a thermal conductivity greater than a thermal conductivity of the substrate.

8. The illumination device of claim 6, wherein the material comprises at least one of metal, plastic, tape, adhesive, glue, or fabric.

9. The illumination device of claim 1, further comprising a cover disposed over an entirety of the first portion of the light sheet to substantially block emission of light therefrom.

10. The illumination device of claim 1, wherein at least a portion of the substrate has a reflectance greater than 60% to a wavelength of light emitted by a light-emitting element.

11. The illumination device of claim 1, further comprising a fixture on which the light sheet is disposed,
wherein (i) a combined length of the first and second portions of the light sheet is longer than a length of the fixture, and (ii) the second portion of the light sheet has a length no greater than the length of the fixture.

12. The illumination device of claim 11, wherein no portion of the fixture is disposed between the first and second portions of the light sheet.

13. The illumination device of claim 11, wherein a portion of the fixture is disposed between the first and second portions of the light sheet.

14. The illumination device of claim 13, wherein the portion of the fixture disposed between the first and second portions of the light sheet has a thermal conductivity greater than a thermal conductivity of the substrate.

15. The illumination device of claim 11, wherein at least a portion of the second portion of the light sheet is attached to the fixture.

16. The illumination device of claim 11, further comprising a plurality of conductive traces disposed on the substrate and electrically interconnecting the plurality of light-emitting elements into a plurality of light-emitting strings,
wherein:
the light-emitting elements are spaced apart at a light-emitting-element pitch in a third direction along the light sheet,
the light-emitting strings are spaced apart, in the third direction, at a string pitch that is equal to or greater than the light-emitting-element pitch, and
proximate the fold, a first portion of a first light-emitting string is disposed on the first portion of the light sheet and a second portion of the first light-emitting string is disposed on the second portion of the light sheet.

17. The illumination device of claim 11, further comprising a cover disposed over at least a portion of the first portion of the light sheet to substantially block emission of light therefrom.

18. The illumination device of claim 11, further comprising a cover disposed over an entirety of the first portion of the light sheet to substantially block emission of light therefrom.

19. An illumination device comprising:
a flexible light sheet that is substantially planar in an unfolded configuration, the light sheet comprising (i) a flexible substrate having first and second opposed surfaces and (ii) a plurality of light-emitting elements disposed over the first surface of the substrate; and
a plurality of conductive traces disposed on the substrate and electrically interconnecting the plurality of light-emitting elements into a plurality of light-emitting strings,
wherein:
the light sheet is folded along a fold dividing a first portion of the light sheet from a second portion of the light sheet,
the first portion of the light sheet comprises a first group of one or more of the light-emitting elements disposed thereon,
the second portion of the light sheet comprises a second group of one or more of the light-emitting elements disposed thereon,
proximate the fold, (a) the first portion of the light sheet is disposed beneath the second portion of the light sheet, (b) the first group of one or more of the light-emitting elements emits light in a first direction, and (c) the second group of one or more of the light-emitting elements emits light in a second direction different from the first direction,
light is emitted by both the first and second groups of light-emitting elements,
the light-emitting elements are spaced apart at a light-emitting-element pitch in a third direction along the light sheet,
the light-emitting strings are spaced apart, in the third direction, at a string pitch that is equal to or greater than the light-emitting-element pitch, and
proximate the fold, a first portion of a first light-emitting string is disposed on the first portion of the light sheet and a second portion of the first light-emitting string is disposed on the second portion of the light sheet.

20. The illumination device of claim 19, wherein the second surface of the first portion of the light sheet is adjacent to the second surface of the second portion of the light sheet.

21. The illumination device of claim 19, wherein at least a portion of the second surface of the first portion of the light sheet is in contact with at least a portion of the second surface of the second portion of the light sheet.

22. The illumination device of claim 19, wherein at least a portion of the second surface of the first portion of the light sheet is adhered directly to at least a portion of the second surface of the second portion of the light sheet with an adhesive.

23. The illumination device of claim 19, further comprising a cover disposed over at least a portion of the first portion of the light sheet to substantially block emission of light therefrom.

24. The illumination device of claim 19, further comprising a fixture on which the light sheet is disposed,
wherein (i) a combined length of the first and second portions of the light sheet is longer than a length of the fixture, and (ii) the second portion of the light sheet has a length no greater than the length of the fixture.

25. An illumination device comprising:
a flexible light sheet that is substantially planar in an unfolded configuration, the light sheet comprising (i) a flexible substrate having first and second opposed surfaces and (ii) a plurality of light-emitting elements disposed over the first surface of the substrate; and
a cover,
wherein:
the light sheet is folded along a fold dividing a first portion of the light sheet from a second portion of the light sheet,
the first portion of the light sheet comprises a first group of one or more of the light-emitting elements disposed thereon,
the second portion of the light sheet comprises a second group of one or more of the light-emitting elements disposed thereon,
proximate the fold, (a) the first portion of the light sheet is disposed beneath the second portion of the light sheet, (b) the first group of one or more of the light-emitting elements emits light in a first direction, and (c) the second group of one or more of the light-emitting elements emits light in a second direction different from the first direction,
light is emitted by both the first and second groups of light-emitting elements, and
the cover is disposed over at least a portion of the first portion of the light sheet to substantially block emission of light therefrom.

26. The illumination device of claim 25, wherein the second surface of the first portion of the light sheet is adjacent to the second surface of the second portion of the light sheet.

27. The illumination device of claim 25, wherein at least a portion of the second surface of the first portion of the light sheet is in contact with at least a portion of the second surface of the second portion of the light sheet.

28. The illumination device of claim 25, wherein at least a portion of the second surface of the first portion of the light sheet is adhered directly to at least a portion of the second surface of the second portion of the light sheet with an adhesive.

29. The illumination device of claim 25, further comprising a fixture on which the light sheet is disposed,
wherein (i) a combined length of the first and second portions of the light sheet is longer than a length of the fixture, and (ii) the second portion of the light sheet has a length no greater than the length of the fixture.

* * * * *